(12) United States Patent
Konshak et al.

(10) Patent No.: US 6,819,560 B2
(45) Date of Patent: Nov. 16, 2004

(54) FORCED AIR SYSTEM FOR COOLING A HIGH DENSITY ARRAY OF DISK DRIVES

(75) Inventors: Michael V. Konshak, Louisville, CO (US); Dale R. Eichel, Broomfield, CO (US); Jimmy R. Fechner, Lafayette, CO (US)

(73) Assignee: Storage Technology Corporation, Louisville, CO (US)

( * ) Notice: Subject to any disclaimer, the term of this patent is extended or adjusted under 35 U.S.C. 154(b) by 71 days.

(21) Appl. No.: 10/266,143

(22) Filed: Oct. 7, 2002

(65) Prior Publication Data

US 2004/0008484 A1 Jan. 15, 2004

Related U.S. Application Data

(60) Provisional application No. 60/395,055, filed on Jul. 11, 2002.

(51) Int. Cl.[7] ............................................... G06F 1/16
(52) U.S. Cl. ........................................ 361/687; 361/683
(58) Field of Search ................................ 361/679, 683, 361/684–686, 724–734, 687–695

(56) References Cited

U.S. PATENT DOCUMENTS

| | | |
|---|---|---|
| 4,504,936 A | 3/1985 | Faber et al. |
| 4,674,004 A | 6/1987 | Smith et al. |
| 4,754,397 A * | 6/1988 | Varaiya et al. ............... 361/685 |
| 5,063,476 A | 11/1991 | Hamadah et al. |
| 5,168,424 A * | 12/1992 | Bolton et al. ................ 361/695 |
| 5,206,845 A | 4/1993 | Baxter et al. |
| 5,237,484 A | 8/1993 | Ferchau et al. |
| 5,274,530 A | 12/1993 | Anderson |
| 5,412,661 A | 5/1995 | Hao et al. |
| 5,446,855 A | 8/1995 | Dang et al. |
| 5,515,515 A | 5/1996 | Kennedy et al. |
| 5,566,316 A | 10/1996 | Fechner et al. |
| 5,604,662 A | 2/1997 | Anderson et al. |
| 5,615,352 A | 3/1997 | Jacobson et al. |
| 5,634,810 A | 6/1997 | Niitsu et al. |
| 5,680,294 A | 10/1997 | Stora et al. |
| 5,751,549 A | 5/1998 | Eberhardt et al. |
| 5,757,617 A | 5/1998 | Sherry |
| 5,832,198 A | 11/1998 | Lucht |
| 5,914,858 A | 6/1999 | McKeen et al. |
| 5,941,994 A | 8/1999 | DeKoning et al. |
| 6,052,278 A | 4/2000 | Tanzer et al. |
| 6,098,114 A | 8/2000 | McDonald et al. |
| 6,138,176 A | 10/2000 | McDonald et al. |
| 6,145,028 A | 11/2000 | Shank et al. |
| 6,166,900 A | 12/2000 | Flynn et al. |
| 6,222,699 B1 | 4/2001 | Luffel et al. |
| 6,288,902 B1 | 9/2001 | Kim et al. |
| 6,301,625 B1 | 10/2001 | McDonald et al. |
| 6,317,334 B1 | 11/2001 | Abruzzini et al. |
| 6,356,441 B1 | 3/2002 | Claprood |
| 6,381,139 B1 | 4/2002 | Sun |
| 6,452,809 B1 * | 9/2002 | Jackson et al. ............. 361/796 |
| 6,510,050 B1 * | 1/2003 | Lee et al. ................... 361/685 |
| 6,563,706 B1 * | 5/2003 | Strickler .................... 361/695 |
| 2001/0021099 A1 | 9/2001 | Siedow et al. |

OTHER PUBLICATIONS

Nexsan Technologies, InfiniSAN ATAboy, pp. 1–2.
Nexsan Technologies, InfiniSAN ATAboy2, pp. 1–2.
Nexsan Technologies, InfiniSAN D2D, pp. 1–2.

(List continued on next page.)

Primary Examiner—Yean-Hsi Chang
(74) Attorney, Agent, or Firm—Brooks Kushman P.C.

(57) ABSTRACT

A cooling system for a data storage assembly having multiple disk drives disposed on a replaceable module. Air is drawn into a housing for the data storage assembly and through a planar array of disk drives, through a set of blowers and across a set of power supplies. Plenums are provided on top of and below the disk drives and the blowers. Air flowing through the array of disk drives only flows across a single layer of disk drives.

18 Claims, 18 Drawing Sheets

OTHER PUBLICATIONS

FalconStor Software, "The Value of Storage Virtualization" A White Paper, pp. 1–12.

FalconStor Software, IPStor™, The Art of Storage Networking, pp. 1–6.

SANsymphony™, Version 5 DataSheet, pp. 1–8.

Alacritus™ Software, New Tape Library Alternative from Alacritus Software™, Protects Corporate Data Assets, Ensures High Quality Performance, & Reduces Storage Management Costs, pp. 1–4.

Double–Take®, The Protection of Real–Time Data Replication in a Multi–Platform, Software Solution, pp. 1–2.

* cited by examiner

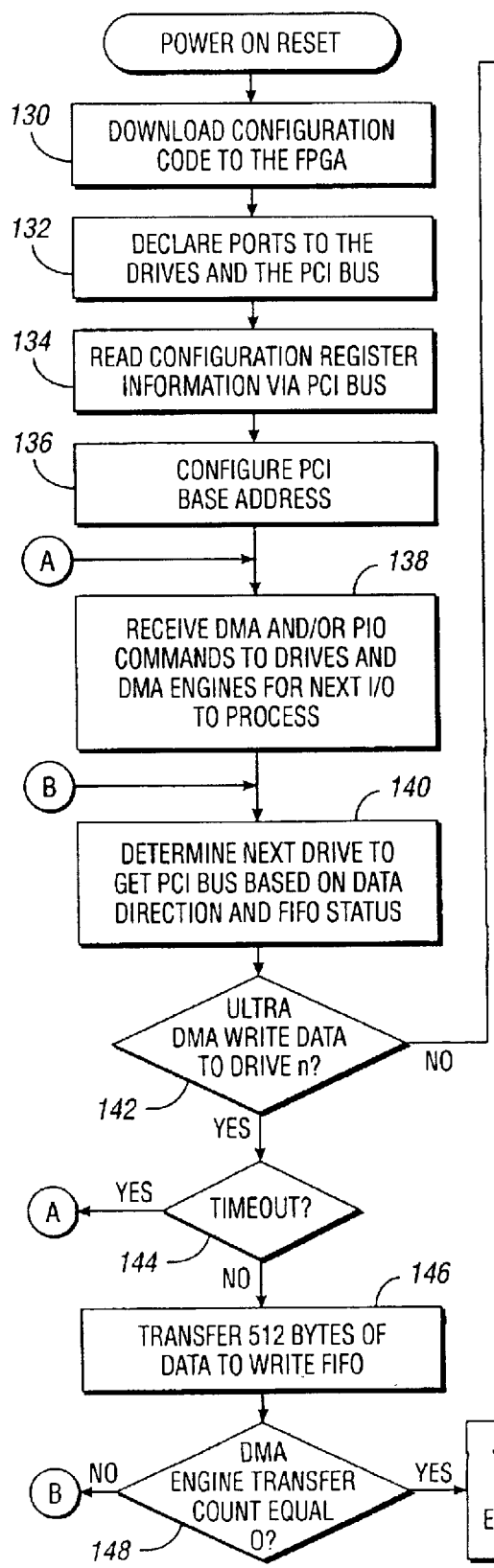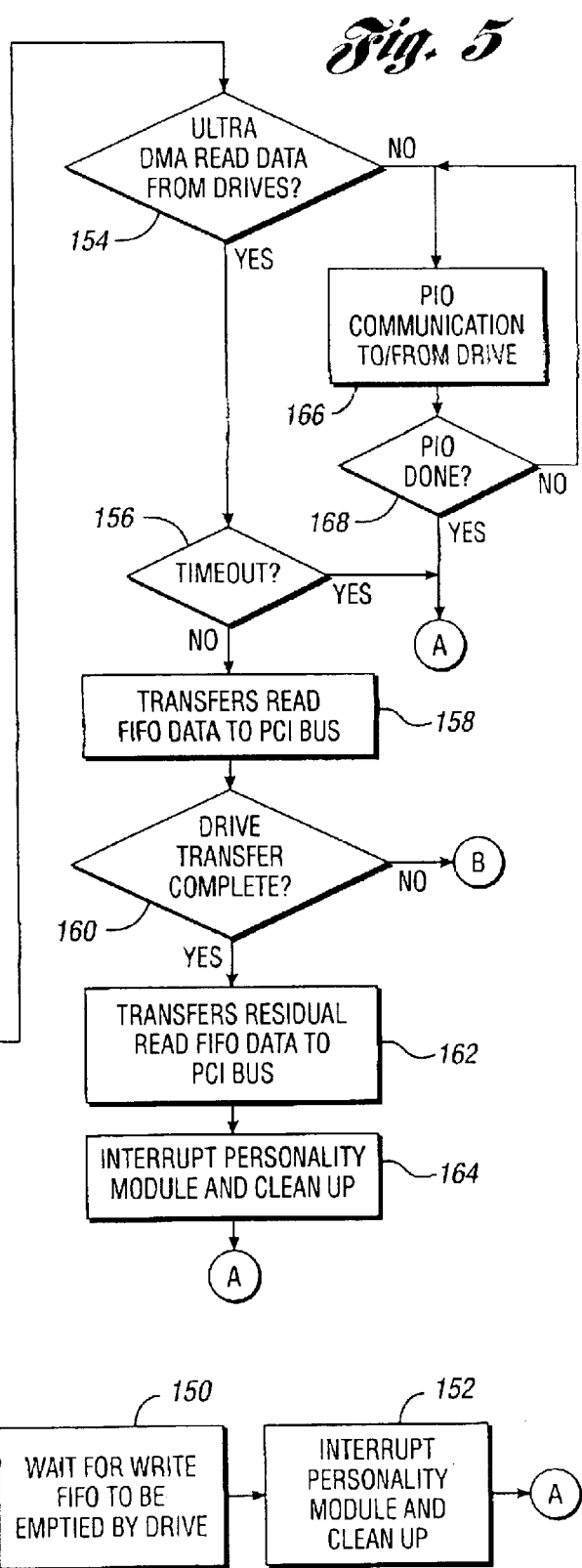
Fig. 5

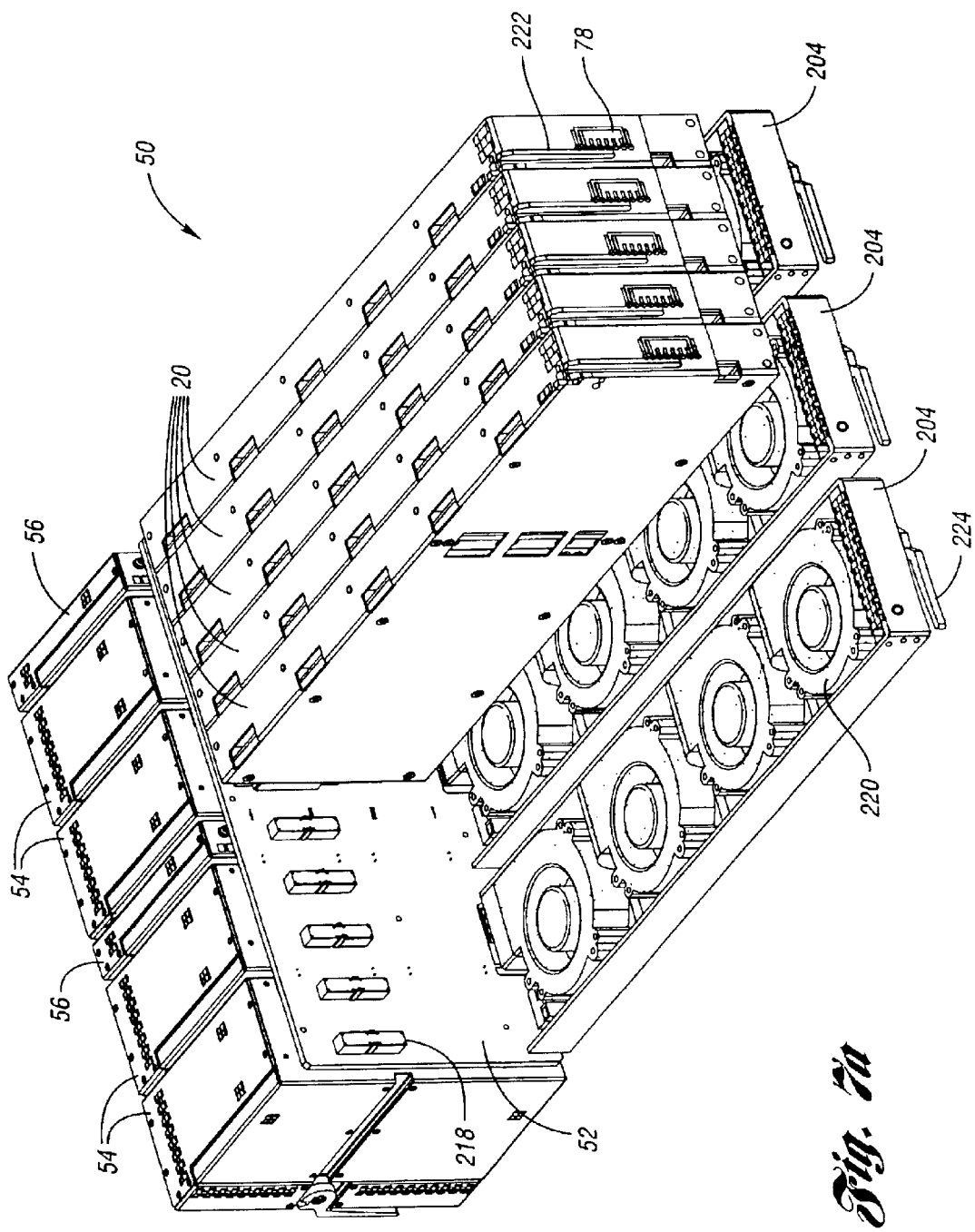

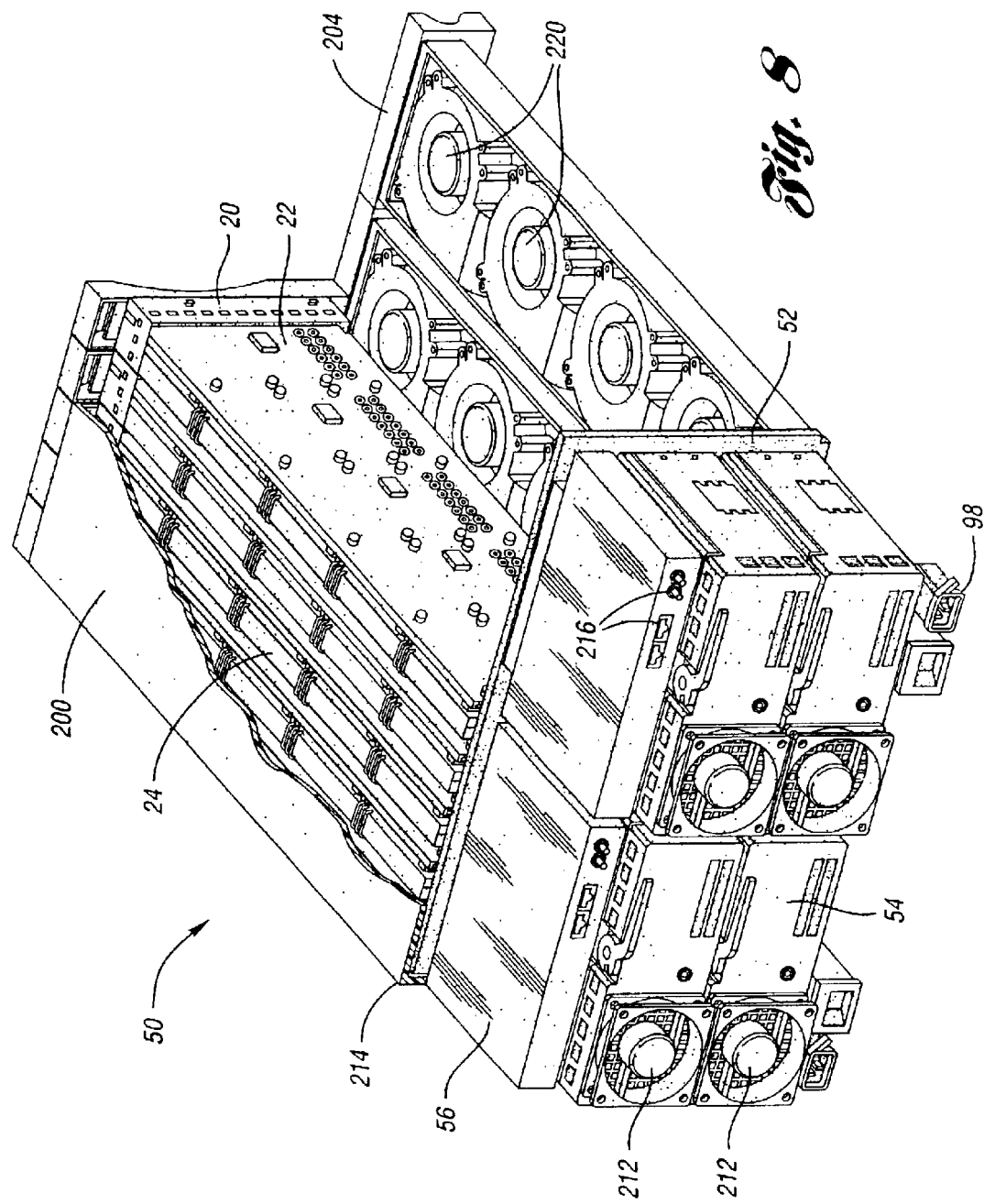

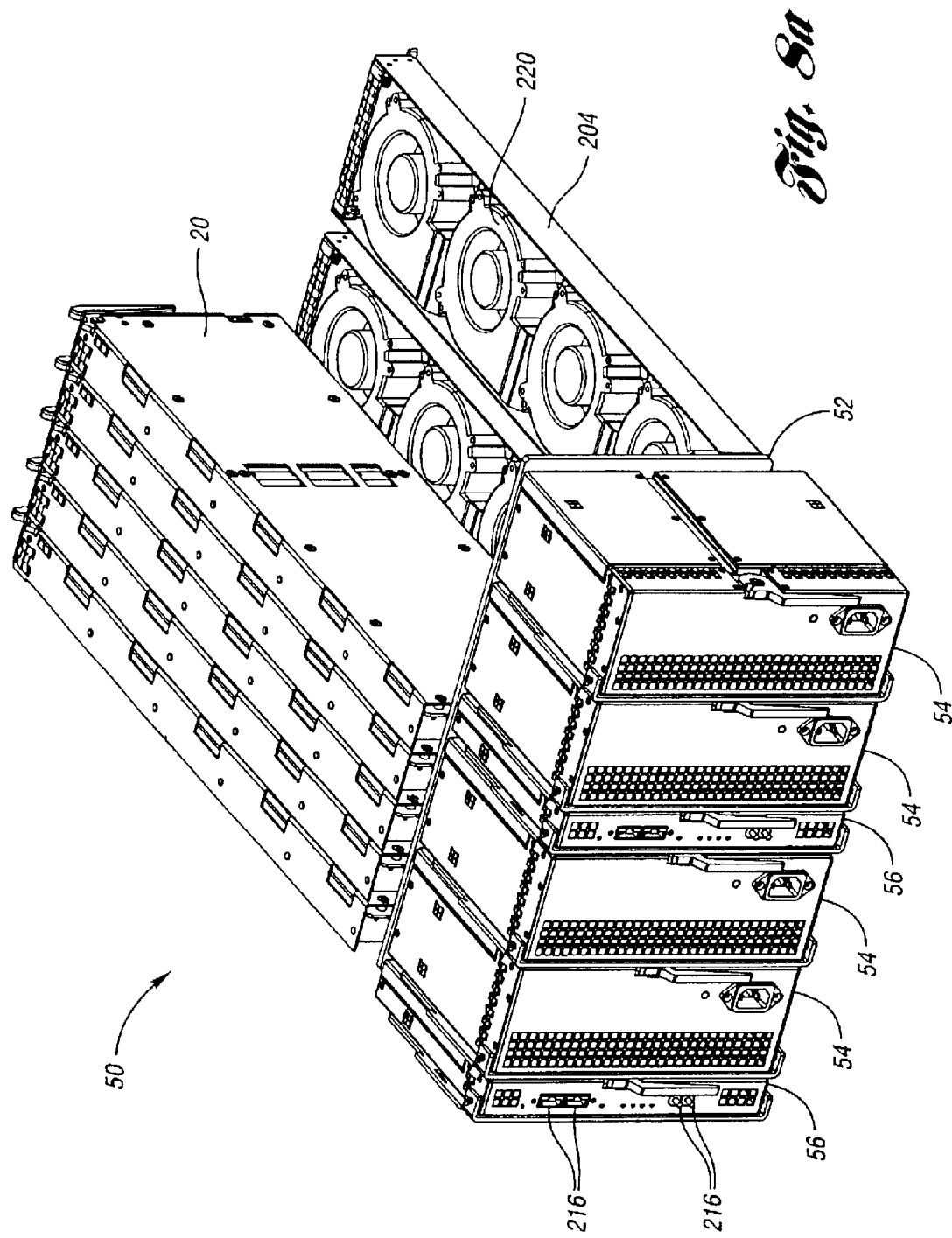

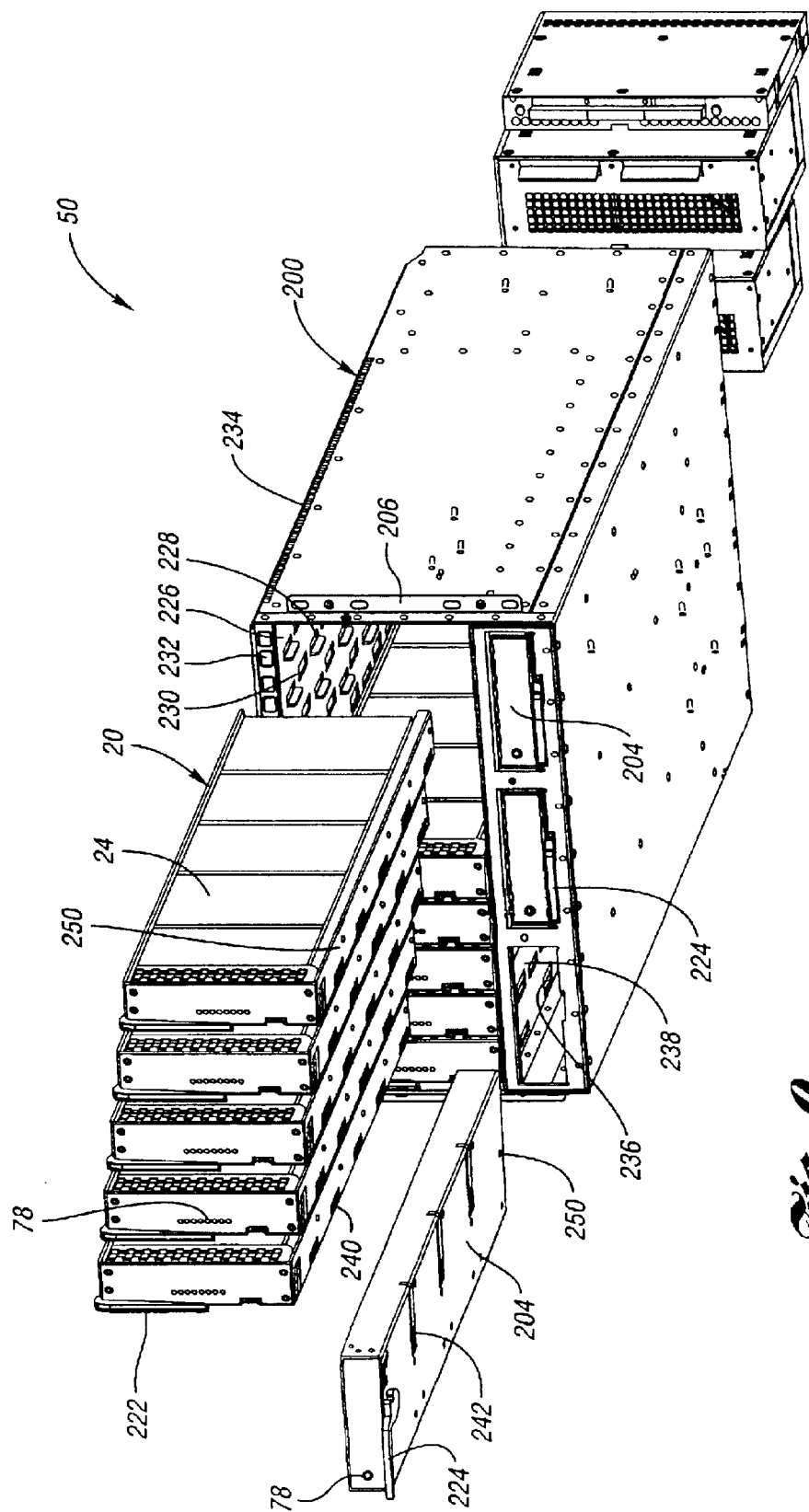

FORCED AIR SYSTEM FOR COOLING A HIGH DENSITY ARRAY OF DISK DRIVES

CROSS-REFERENCE TO RELATED APPLICATIONS

This application claims the benefit of U.S. provisional application Ser. No. 60/395,055 filed Jul. 11, 2002.

BACKGROUND OF THE INVENTION

1. Field of the Invention

The present invention relates to modular multiple disk drive assemblies.

2. Background Art

Greater quantities of data are being generated and stored by computer systems. Some data, such as intermediate calculations, is discarded almost immediately. However, an increasing amount of data must be stored for extended periods of time. This period of time may range from minutes to years depending on the type of data, type of application which generates or uses the data, and requirements imposed by government regulations, business practices, historical needs, and the like.

Long term data storage must often meet apparently conflicting performance criteria. Ideally, all storage should have a low cost-per-bit of data stored. This stored data must be stored and readily retrievable in a brief period of time. This time may be measured in a variety of ways, such as the time before the first data is transferred, the amount of data received each second, the total access time for a given quantity of data, and the like. Space required to store the data becomes an increasingly important parameter as the amount of data increases. Additionally, high reliability is required for stored data. This reliability can be achieved through the use of highly dependable storage devices, through the use of systems for correcting or recovering data, through redundancy of storage equipment, and the like.

Traditionally, no one type of storage device has been able to satisfy cost, speed, density and reliability requirements. High performance magnetic disks have been used as a first level of data storage due to their high data rates and low access times. However, high performance magnetic disk systems tended to be relatively expensive and low density. Secondary storage for backup, archiving and very large storage requirements has typically been provided by magnetic tape. Magnetic tape offered greater storage density and lower cost-per-bit than high performance magnetic disk systems, but often suffered from greatly increased data access time.

Increasingly, a wide gap is developing between the characteristics of high performance disk systems and tape systems. Various attempts at providing an intermediate level of long term storage have not met with great commercial success. One technique is to use a collection of inexpensive, low performance disks. An example of low performance disks are those meeting the ATA standard such as those used in many personal computers. However, implementing groups or arrays of these inexpensive, low performance disks exhibit certain difficulties. For example, inexpensive disks are typically incompatible with high speed media interfaces such as Fibre Channel (FC), SCSI, iSCSI, ESCON and the like. Another problem with arrays of inexpensive disks is that such arrays tend not to provide any increase in storage density over high performance disk systems. Yet another problem with arrays of inexpensive disks is that such arrays are typically designed for special purpose use only and are not compatible or configurable for use with a large number of high performance computer interfaces or applications.

SUMMARY OF THE INVENTION

The present invention fulfills the need for intermediate storage with performance characteristics similar to high performance disk systems as well as cost and density characteristics comparable to tape systems. Storage assemblies include programmable logic allowing each assembly to appear as a wide variety of different storage devices. The present invention includes data storage assemblies having multiple data storage units, such as disk drives or other data storage devices, co-located onto a replaceable assembly. In one embodiment, multiple storage assemblies are integrally connected to a single chassis for ease of hot plug insertion and removal.

The present invention provides for scalable and incremental increase of storage capacity and performance. The modular design provides for sharing of power and cooling facilities, thus reducing product cost and simplifying manufacturing and reliability. The ability to work with any high performance data storage interface allows data storage units to be utilized to maximum potential. Data storage units, such as ATA disk drives, are connected within small groups so that aggregate performance and functional capabilities can be combined into a higher performing complete storage assembly.

In one embodiment of the present invention, each module contains five ATA disk drive assemblies. Individual data storage assemblies contain control electronics and a data connection interface which presents and emulates the electrical image of a single disk drive, tape drive, tape library or the like for connection to industry standard FC interfaces. These modules may be held in a single chassis. An implementation with ten modules contains a total of fifty individual disk drives, providing a high performance architecture that aggregates benefits of the individual disk drives in a very condensed package. This architecture also provides a compact means of providing a high capacity, high band width data storage solution at minimal production cost. This architecture also integrally contains sufficient modularity to provide scalable storage capacity with new assemblies. New generation disk storage capacity or other technologies may easily be incorporated into the modular assemblies to provide increased flexibility in product implementation.

BRIEF DESCRIPTION OF THE DRAWINGS

FIG. 5 is a flow diagram illustrating operation of a storage module controller according to an embodiment of the present invention;

FIG. 7 is a fragmentary front perspective view of the data storage module according to an embodiment of the present invention and FIG. 7a is an alternative embodiment;

FIG. 8 is a fragmentary rear perspective view of the data storage module according to an embodiment of the present invention and FIG. 8a is an alternative embodiment;

FIG. 9 is an exploded perspective view of the data storage module according to an embodiment of the present invention;

DETAILED DESCRIPTION OF THE PREFERRED EMBODIMENT(S)

Figure 1:
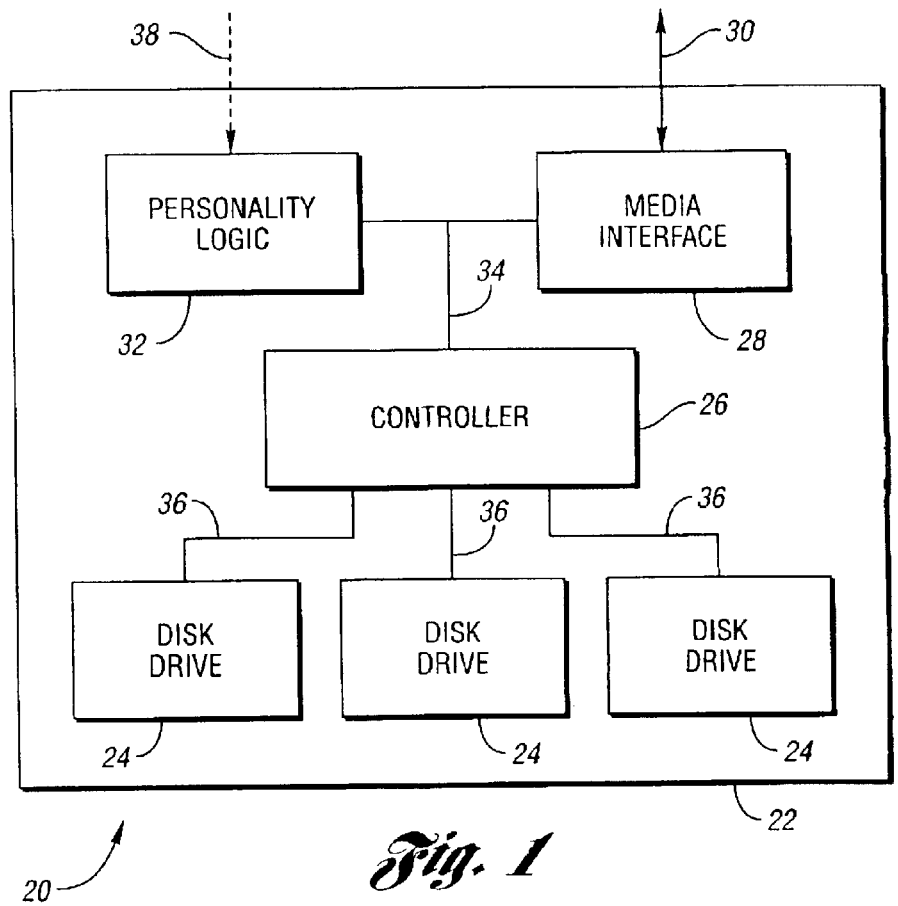
FIG. 1 is a diagram illustrating the functional relationship of the components of a data storage module according to an embodiment of the present invention.

Referring now to FIG. 1, a data storage module according to an embodiment of the present invention is shown. A data storage module or blade, shown generally by 20, includes printed circuit board 22. Multiple storage units such as disk drives 24 are affixed or coupled to printed circuit board 22. Controller 26 is mounted on printed circuit board 22. Controller 26 receives data access commands, writes data to storage units 24 based on the received commands and reads data from storage units 24 based on the received commands. Media interface 28 is also mounted on printed circuit board 22. Media interface 28 communicates over interconnection media 30 in a format compatible with interconnection media 30. Personality logic 32 is also mounted on printed circuit board 22. Personality logic 32 provides a programmable personality causing data storage module 20 to appear over media 30 as a kind of storage device different than storage modules 24.

Media 30 interfacing data storage module 20 with devices outside of data storage module 20 may be implemented in a wide variety of physical forms such as optical cable, electrical cable, wireless channel, backplane, and the like. Various media standards may be supported such as FC, Ethernet, ESCON, and the like. Data may be transmitted over media 30 serially or in parallel. Media 30 may support a variety of formats and protocols, including the Internet Protocol (IP), and may permit devices interconnected by media 30 to communicate via a variety of command standards such as SCSI and iSCSI. Data storage module 20 may also support more than one media interface 28 allowing access by more than one type of media 30.

Storage modules 24 are preferably inexpensive magnetic disk drives such as disk drives conforming to an ATA standard. Each disk drive 24 communicates with controller 26 over parallel or serial interface 36. Disk drives may also be connected to controller 26 through daisy chaining. The number of disk drives 24 affixed to printed circuit board 22 may be chosen such that the combined data rate for accessing disk drives 24 closely matches the data rate on bus 34 interfacing controller 26 with at least one of media interface 28 and personality logic 32. Another factor in determining the number of disk drives 24 affixed to printed circuit board 22 is the amount of space available on printed circuit board 22.

Controller 26 implements queues and DMA channels permitting data storage module 20 to concurrently access each disk drive 24 affixed to printed circuit board 22. Controller 26 may be implemented with programmable logic allowing greater flexibility for data storage module 20. Controller 26 also contains arbitration logic. For example, arbitration logic permits giving preference to data writes over data reads. Typically, an access to read data from disk drive 24 will read ahead additional data not directly requested. Thus, queues within controller 26 may already hold data satisfying future read access requests. In contrast, interrupting a sequential write may cause the area on the disk to which data will be written to spin past the head of disk drive 24, slowing down the write process. Additionally, arbitration logic in controller 26 determines access to bus 34 by various channels and queues supporting disk drives 24.

Personality logic 32 is programmable to allow data storage module 20 to appear as one or more of a variety of different storage devices. For example, a device accessing data storage module 20 through media 30 may believe it is communicating with a single SCSI disk drive. Personality logic 32 receives SCSI access commands, determines which, if any, of disk drives 24 will respond to the SCSI command, generates any ATA commands necessary to implement the received SCSI command, and forwards these ATA commands to controller 26. Personality logic 32 can be programmed to make data storage module 20 appear as one or more disk drives, tape drives, tape auto loaders, tape libraries, optical devices, and the like. Further, personality logic 32 may be programmed to permit data storage module 20 to respond as if it were a SCSI device, iSCSI device, ESCON device, or any device having other storage command formats.

Personality logic 32 may be programmed to provide data storage module 20 with features not available with the type of storage device implemented in storage modules 24. For example, ATA disk drives 24 traditionally have not support command queuing. Personality logic 32 may be programmed to permit data storage module 20 to appear as a SCSI device which supports command queuing. SCSI commands received over media 30 are queued within personality logic 32 and released as ATA commands to controller 26 one at a time. Another example is the SCSI command to "write same," which permits the same data to be simultaneously written to several SCSI storage devices. Personality logic 32, upon receiving such a command, would determine which disk drives 24 represent the virtual SCSI storage devices requested in the command and generate appropriate ATA commands for disk drives 24 to write multiple copies of the data.

Personality logic 32 may also be programmed to implement one or more logical devices with disk drives 24. For example, personality logic 32 maps each received logical unit number (LUN) into a physical address on one of disk drives 24. Thus, data storage module 20 may be made to appear as any number of storage devices to a device accessing data storage module 20. Further, personality logic 32 may map requests for specific tape cartridges into one or more regions of disk drives 24 allowing data storage module 20 to appear as a single tape cartridge, a virtual tape cartridge, or an entire tape library.

Personality logic 32 may also process commands received over media 30 to accelerate any data access request. For example, personality logic 32 can sort data access commands to improve the seek performance of disk drives 24. Commands may also be coalesced to reduce the number of ATA commands sent to controller 26. In the case of data read request, data returned by controller 26 can then be partitioned to satisfy the coalesced data requests.

Personality logic 32 may also be programmed to improve the reliability of storage devices 24. For example, personality logic 32 may implement one or more RAID algorithms to provide data striping, parity generation, data duplication, and the like.

Personality logic 32 may be programmed through media 30. For example, if data storage module 20 is presented as a SCSI device, commands for writing diagnostics or writing buffers may be interpreted by personality logic 32 as programming commands. A password may be embedded into the command header to prevent unintentional or malicious reprogramming of personality logic 32. Serial link 38 to personality logic 32 may also be used to program personality logic 32. Serial link 38 may conform to any common serial standard.

Printed circuit board 22 may be built as a single, physical board. To prevent excessive warping due to the weight of disk drives 24 or to facilitate manufacturing methods, printed circuit board 22 may also be constructed as several separate boards which are linked in data storage module 20.

Figure 2:
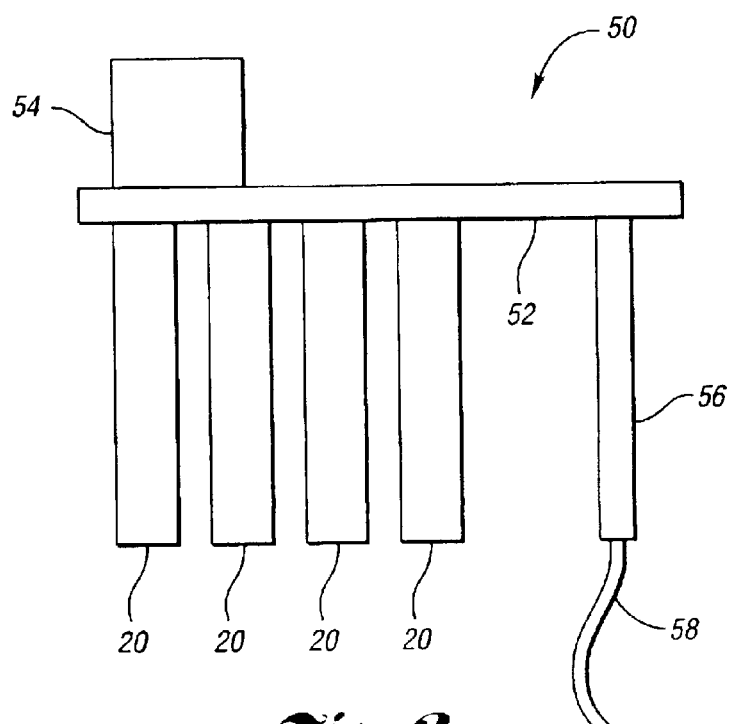
FIG. 2 is a schematic drawing of a data storage system according to an embodiment of the present invention.

Referring now to FIG. 2, a data storage system according to an embodiment of the present invention is shown. A data storage system, shown generally by 50, includes a plurality of data storage modules 20. Each data storage module 20 plugs into backplane 52. Power is supplied to data storage modules 20 through backplane 52 by power supply 54. Data storage system 50 may also include one or more communication modules 56 receiving high speed cabling 58 connected to a data access device, such as a host computer or storage controller, or to a data access network such as a wide area network (WAN), local area network (LAN), storage area network (SAN), or the like. In the embodiment shown, communication module 56 is connected to data storage modules 28 through backplane 52. In addition to, or instead of communication module 56, each data storage module 20 may accept one or more high speed cables 58.

Data storage system 50 may be housed within its own enclosure. In other embodiments, data storage module 20 may be incorporated into data storage system 50 implemented within another device such as a storage manager, information router, information switch, or the like. In such cases, media 30 will include a backplane within the manager, router or switch.

Figure 3:
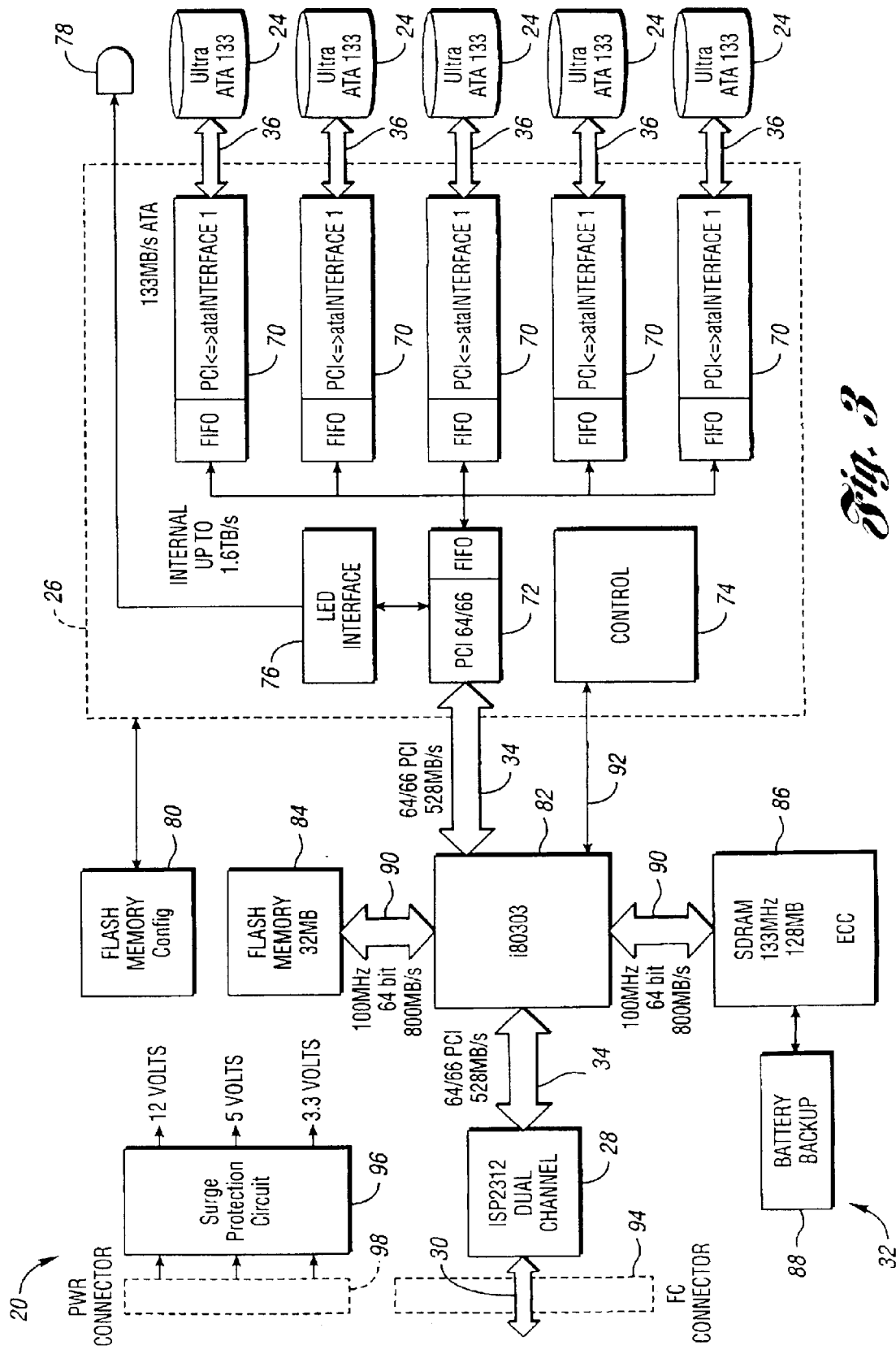
FIG. 3 is a schematic diagram of a data storage module according to an embodiment of the present invention.

Referring now to FIG. 3, a schematic diagram of a data storage module according to an embodiment of the present invention is shown. Data storage module 20 includes five disk drives 24 conforming to the Ultra ATA 133 standard. Each disk drive 24 interfaces with controller 26 via a dedicated ATA bus 36 capable of data transfer rates at 133 MB/s. Controller 26 may be implemented in a field programmable gate array (FPGA) such as the Xilinx XCV600E-432BGA. Controller 26 includes storage device interface logic 70 corresponding with each disk drive 24. PCI interface logic 72 interfaces controller 26 with PCI bus 34. Control logic 74 supervises the operation of controller 26. Further details regarding storage device interface logic 70, PCI interface logic 72 and control logic 74 are provided below. Controller 26 also includes LED interface logic 76 controlling one or more LED indicators 78 to provide indications of the operation of data storage module 20. Controller 26 is programmed from configuration flash memory 80.

Personality logic 32 is implemented with microprocessor 82 such as, for example, an Intel i80303. Personality flash memory 84 holds personality programming executed by microprocessor 82. Temporary storage is provided by memory 86 which may include battery backup 88. Flash memory 80, 84 may be programmed by commands received over media 30 or may be programmed through a serial interface, such as serial interface 38, not shown in FIG. 3. Flash memory 80 may have a separate serial interface, may be connected to microprocessor 82 via memory bus 90 or may be connected to microprocessor 82 through PCI bus 34. Control signals 92 provide status and interface signals from controller 26 to microprocessor 82. Control signals 92 are also used to initiate configuration and operation of controller 26.

Media interface 28 is implemented through a dual channel FC interface provided, for example, by a QLogic ISP2312. Typically, media interface 28 includes buffer memory and configuration memory not shown for clarity. Media interface 28 connects with media 30 through FC connector 94.

Data storage module 20 may contain additional circuitry such as surge protection circuit 96 which may receive power from a backplane through power connector 98. FC connector 94 and power connector 98 may be implemented in the same physical connector for interface with backplane 52.

Figure 4A:
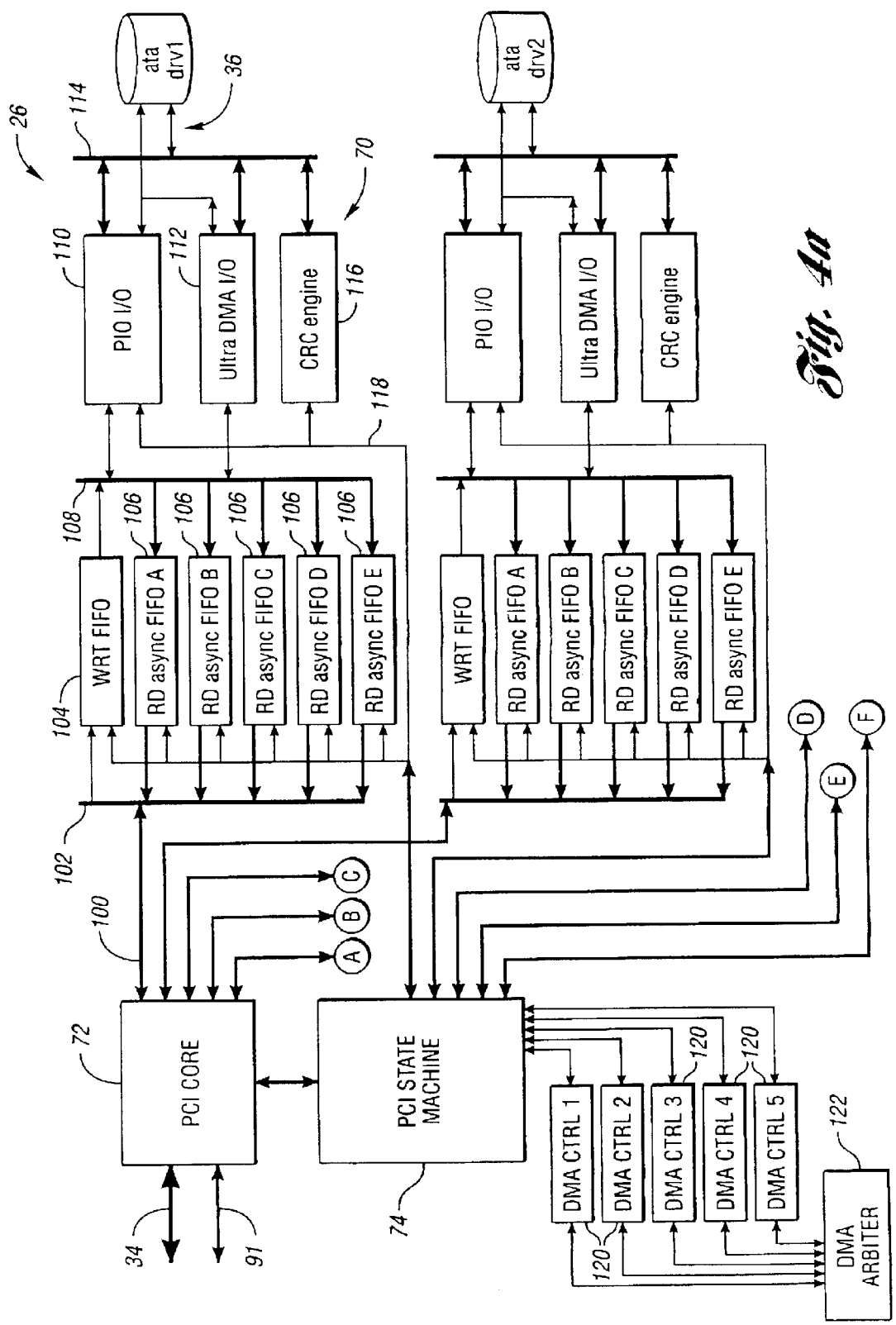
FIG. 4 is a register level drawing illustrating the operation of a data storage module controller according to an embodiment of the present invention.
Figure 4B:
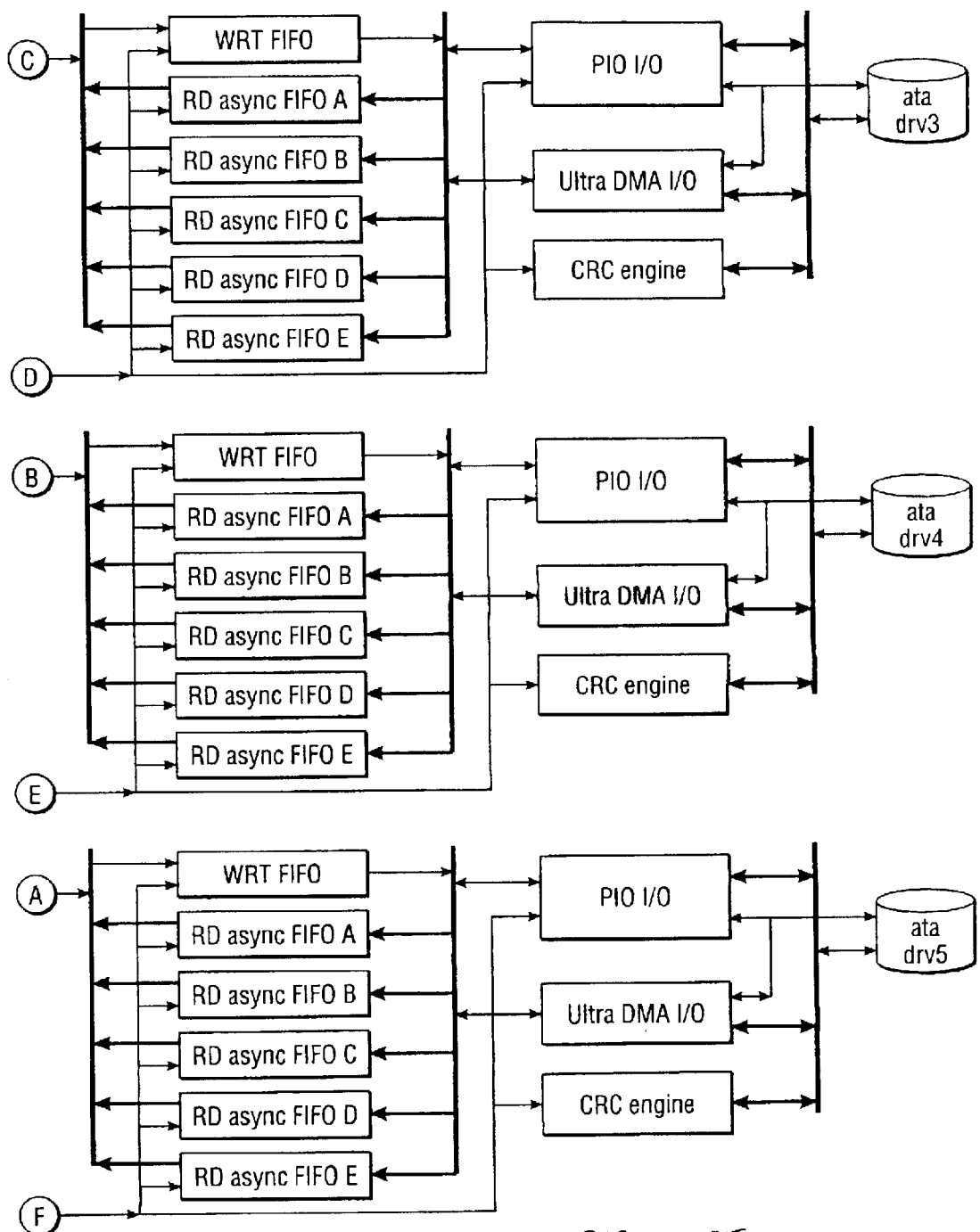

Referring now to FIG. 4, a register level drawing illustrating the operation of a controller according to an embodiment of the present invention is shown. Controller 26 includes five copies of storage device interface logic 70, one copy corresponding to each disk drive 24 supported by controller 26. PCI interface logic 72 is implemented using a PCI core provided within the FPGA. Control logic 74 is implemented as a PCI state machine. Operation of this state machine is described below.

Each copy of storage device interface logic 70 includes a plurality of first-in, first-out (FIFO) queues as well as interface logic. Data bus 100 connects PCI core 72 with PCI-side FIFO bus 102 in storage device interface logic 70. Write FIFO 104 reads data from PCI-side FIFO bus 102. Five read FIFOs 106 write data onto PCI-side FIFO bus 102. DMA-side FIFO bus 108 accepts data from write FIFO 104 and provides data to read FIFOs 106.

Storage device interface logic 70 includes two data paths, PIO data path 110 and Ultra DMA data path 112. PIO data path 110 conforms with the PIO data transfer standard. Ultra DMA data path 112 conforms to the ultra DMA standard. Data paths 110, 112 transfer data between DMA-side FIFO bus 108 and disk bus 114. Data is transferred between disk bus 114 and disk drive 24 through bus 36 connecting controller 26 with disk drive 24. CRC engine 116 reads data from, and writes data to, disk bus 114 to provide error detection and correction.

Storage device interface logic 70 receives control signals 118 from PCI state machine 74. Each storage device interface logic 70 includes DMA control logic 120 for the purpose of streaming data transfers. This unburdens personality logic 32 from being directly involved in the data transfer process, improving performance and increasing efficiency in the overall system. DMA arbiter 122 prioritizes PCI accesses based upon transfer direction and current states of read FIFOs 106 and write FIFOs 104.

In operation, a data access request is received by personality logic 32. This request is converted to commands for one or more drives 24 and DMA engines 70. If multiple drives 24 are involved, commands targeted at drives 24 are started in parallel and are controlled by DMA arbiter 122. Priority is granted first to DMA transfers that are writes and are associated with a nearly empty write FIFO 104. If no such writes exist, the remaining DMA transfers are given round-robin access to a master portion of PCI state machine 74 to execute data transfers. As transfers complete on each drive 24, a check is made to determine if this is the last drive 24 responding to the data access command. If so, the data access command is complete and the next command can commence, if an access command is pending.

During a DMA write operation, DMA control 120 for drive 24 responding to the command continues to fill the corresponding write FIFO 104 as needed until a programmed data count is reached. Drive 24 pulls data from write FIFO 104 as needed. Ultra DMA data path 112 inserts wait states if write FIFO 104 becomes empty. When all write data words are taken from FIFO 104, CRC engine 116 presents the correct CRC 16 word to drive 24.

During a DMA read operation, drive 24 fills read FIFOs 106 with read data. DMA control 120 requests state machine 74 from DMA arbiter 122. DMA control 120 attempts to keep read FIFOs 106 from becoming full. CRC engine 116 calculates a CRC 16 word on all data words received from drive 24 and presents the CRC word to drive 24 at the end of data transference.

Referring now to FIG. 5, a flow diagram illustrating operation of controller 26 according to an embodiment of the present invention is shown. As will be appreciated by one of ordinary skill in the art, the operations illustrated are not necessarily sequential operations. Similarly, operations may be performed by software, hardware, or a combination of both. The present invention transcends any particular implementation and aspects are shown in sequential flow chart form for ease of illustration.

Controller 26 is first initialized. Configuration code from flash memory 80 is downloaded into the FPGA, as in 130. Controller 26 declares input/output ports for each of the five independent drives 24 and PCI bus 34, as in 132. Configuration register information is then read via PCI bus 34, as in 134. PCI configuration is written via bus 34, as in 136.

Commands to drives 24 and DMA engines 70 for performing either or both of DMA or a PIO accesses are received, as in block 138. A determination is made as to which drive 24 will next gain use of PCI bus 34 based on the type of access command, read or write, and the status of relevant FIFOs 104, 106, as in block 140. If an Ultra DMA write access has been received, as in 142, and no timeout occurs, as in 144, a block of data is transferred to write FIFO 104 for selected drive 24. A check is made, as in block 148, to determine if the block count is zero. In other words, has all data been received for the selected drive? If not, flow continues with determining the next drive to access PCI bus 34, as in block 140. If the last block has been written to write FIFO 104, controller 26 waits until write FIFO 104 empties, as in 150. Controller 26 then interrupts personality logic 32 for notification of completion and performs any cleanup operations, as in 152. The next command is received, as in block 138.

If the data access operation is an Ultra DMA read, as determined in 154, and no timeout occurs, as in 156, read data from read FIFO 106 is transferred to PCI bus 34. If the read access operation is not complete, as determined in block 160, flow continues with determining the next drive to access PCI bus 34, as in block 140. If the last block has been read from drive 24, any residual data is read from read FIFO 106, as in block 162. Controller 26 then interrupts personality logic 32 for notification of completion and performs any cleanup operations, as in 164. The next command is received, as in block 138.

If the data access is not an Ultra DMA operation, PIO communication occurs with drive 24, as in block 166. A check is made to determine if the PIO operation is completed, as in block 168. If not, PIO communication continues. If PIO operations are completed, the next command is received, as in block 138.

Figure 6:
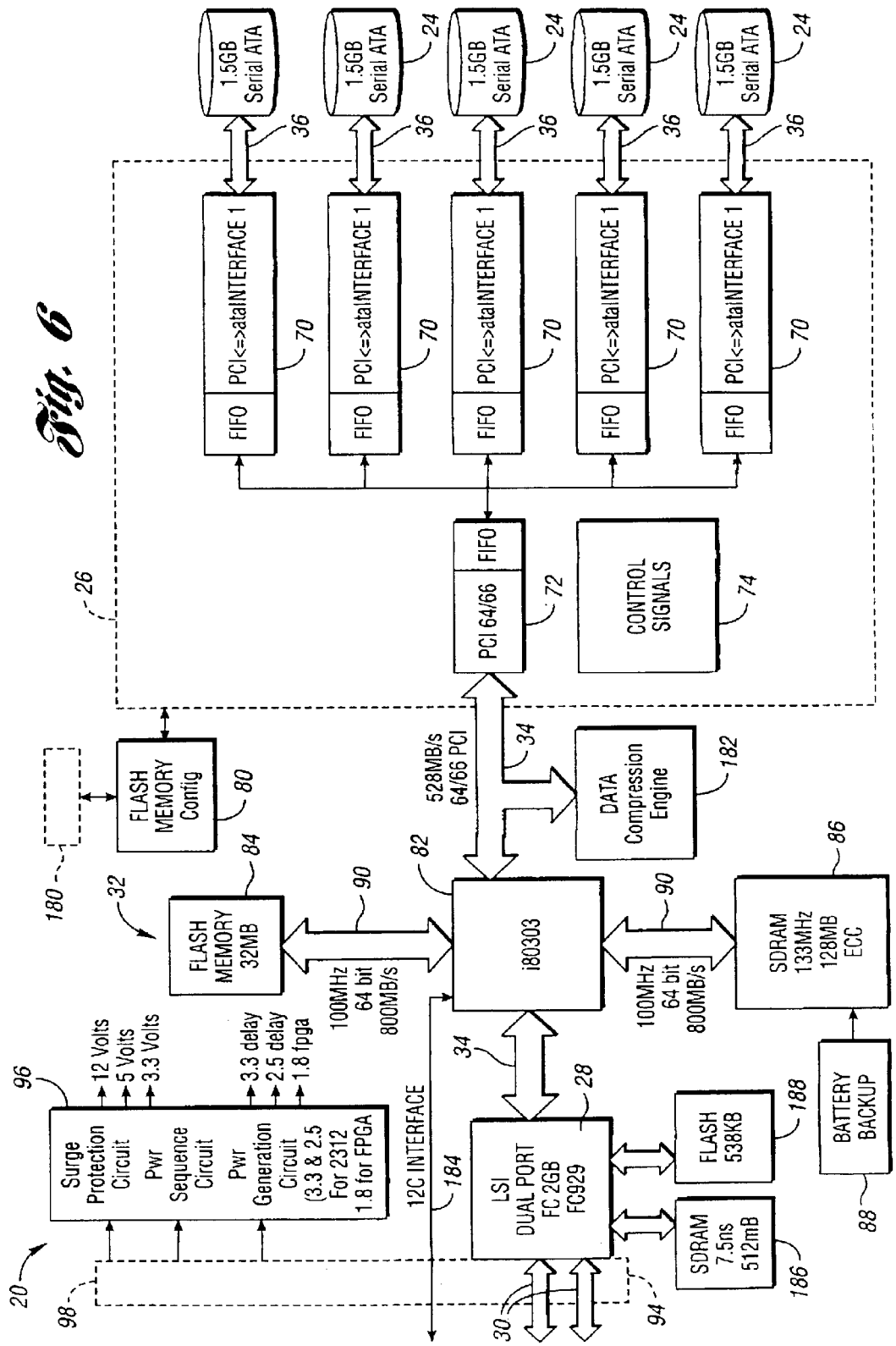
FIG. 6 is a schematic diagram of an alternative embodiment of a data storage module.

Referring now to FIG. 6, a schematic diagram of another embodiment of a data storage module is shown. Data storage module 20 includes five disk drives 24 conforming to a serial ATA standard. Controller 26 is modified to include multiple serial busses 36, each bus 36 corresponding to one disk drive 24. Configuration flash memory 80 for controller 26 is programmable through FPGA program and test connector 180.

Data storage module 20 may support onboard data compression/decompression, data encryption/decryption, or both. Such data manipulation may be performed in software by microprocessor 82. Alternatively, data manipulation may be performed by hardware such as data compression engine 182 attached to PCI bus 34. Integrated circuit chips performing compression and encryption operations are well known in the art.

Personality logic 32 may include serial interface 184. A wide variety of serial interfaces are available, such as I2C interface to processor 82. Serial interface 184 may serve as serial link 38 for programming personality logic 32. Additionally, serial link 184 provides a means by which personality logic 32 may communicate with other data storage modules 20 for a variety of purposes such as data access command sharing, system health monitoring, resource allocation, master/slave operation, and the like.

Media interface 28 in the embodiment shown in FIG. 6 accepts two 2 Gb/s FC media links 30. Media interface 28 is shown implemented with an LSI FC949 dual port FC-to-PCI interface. Memory 186 provides buffer storage locations for media interface 28. Flash memory 188 holds programming for media interface 28.

PCI bus 34 may be replaced with a faster bus such as, for example, a bus conforming to the PCI X standard, to prevent bus 34 from becoming a bottle neck.

Figure 7:
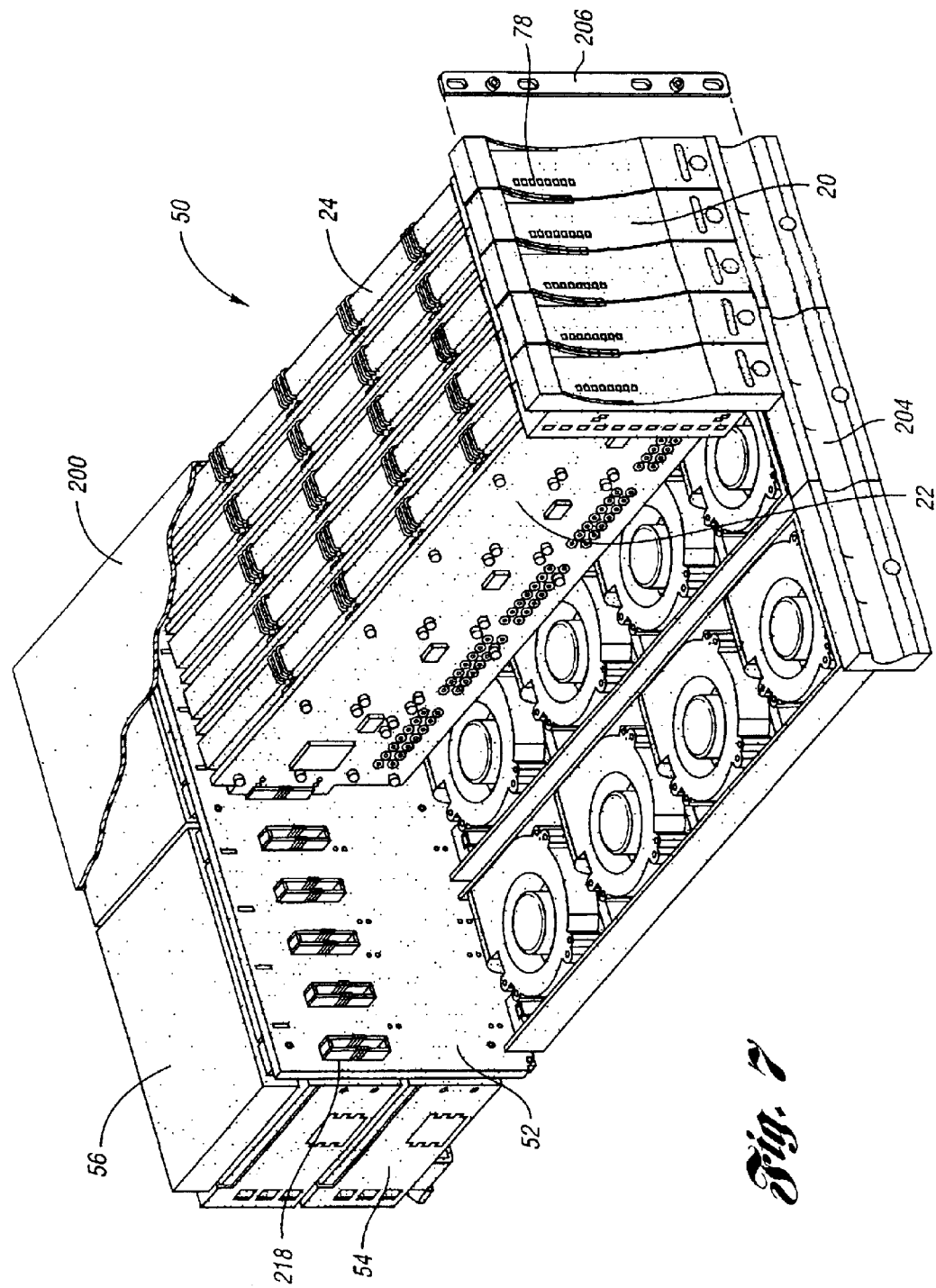

Referring now to FIG. 7, a data storage module according to an embodiment of the present invention is shown. Data storage system 50 is shown to include a module housing 200 for a plurality of data storage modules 20 and a plurality of blower cluster modules 204. LEDs 78 are provided on both the data storage modules 20 and blower cluster modules 204 to indicate the operational status of the modules. An attachment flange 206 is provided to attach the data storage module to a frame, not shown in this view for clarity.

Referring now to FIG. 8, the back of the data storage system 50 is shown to include the module housing 200 that encloses a plurality of power supplies 54 and communication modules 56 such as, for example, loop controller or data channel interface. The power supplies 54 include power supply exhaust blowers 212. A plurality of rear intake vents 214 allow air to be drawn into the module housing 200 above the communication module 56. Each communication module 56 includes FC connectors 216 or other types of data connections such as wire cable, infrared, or radio frequency links. Within housing 200, a plurality of data storage modules 20 each support a plurality of disk drives 24. Printed circuit boards 22 within modules 20 are received on a backplane 52 that separates the power supplies 54 from the disk drives 24. Each blower cluster module 204 is disposed between the drive cluster modules 202 so that air may be drawn through the housing 200 and across the flat planar sides of the disk drives 24. Flow of air through the data storage module 20 will be described in greater detail below. A connector receptacle 218 is provided on the backplane 52. The data storage modules 20 are connected electrically and mechanically to the connector receptacles 218 on backplane 52.

A plurality of blowers 220 are provided in the blower cluster module 204 below each data storage module 20. As shown, each blower cluster module 204 provides ventilation for three data storage modules 20. As used herein a blower should be understood to be an air mover, a device for providing aforesaid air system—or could even be a fan.

Referring now to FIG. 9, data storage module 20 is shown in greater detail. The module housing 200 is shown with the data storage modules 20, blower cluster modules 204, power supplies 54, and communication modules 56 removed from the housing 200. Several data storage modules 20 are shown removed from the housing 200 while additional modules 20 remain within the module housing 200. Each data storage module 20 supports five disk drives 24. A disk drive module lever/latch 222 is also provided on the front of each data storage module 20.

A blower cluster module 204 is shown removed from the housing 200 while two blower cluster modules 204 are shown disposed within the housing. The blower cluster module includes a blower module lever/latch 224 and an LED 78 for showing the operative state of the blower cluster module 204.

The housing 200 includes an upper wall 226 that has upper guide flanges 228 that guide the data storage modules 20 as they are inserted and removed from the housing 200. The upper wall 226 also includes upper air plenum ports 230 through which air is drawn for circulation between the disk drives 24 on the print circuit boards of the data storage modules 20. Front intake vents 232 permit air to flow into the upper portion of the housing 200 through the front data storage system 50. Side intake vents 234 may also be provided to permit air to flow through the side of the module housing 200 adjacent data storage modules 20. Lower air plenum ports 236 are provided in a lower wall 238 of the housing 200. Data storage modules 20 are supported on the lower wall 238. The lower wall 238 separates data storage modules 20 from the blower cluster modules 204. Drive cluster exhaust ports 240 are provided in the lower wall 238. Air is drawn through the drive cluster modules 202 by the blower cluster modules 204 that in turn exhaust air through the blower exhaust ports 242 that are located in the bottom of the blower cluster modules 204.

Plastic bearings 250 are preferably provided on the data storage modules 20 to aid in sliding data storage modules 20 into and out of the housing 200. Plastic bearings 250 also reduce transmission of vibration and noise from data storage modules 20 to the module housing 200. Plastic bearings 250 may also be provided on the blower cluster modules 204 to aid in insertion and removal of the blower cluster modules 204 and also dampen vibrations. Another feature of the plastic bearings, or buttons, 250 is that coupled with the ability of the module chassis to flex, they provide clearance between the module and the overall enclosure thereby reducing the transmission of unwanted rotational vibrations that could inhibit performance of the disk drive.

Figure 10:
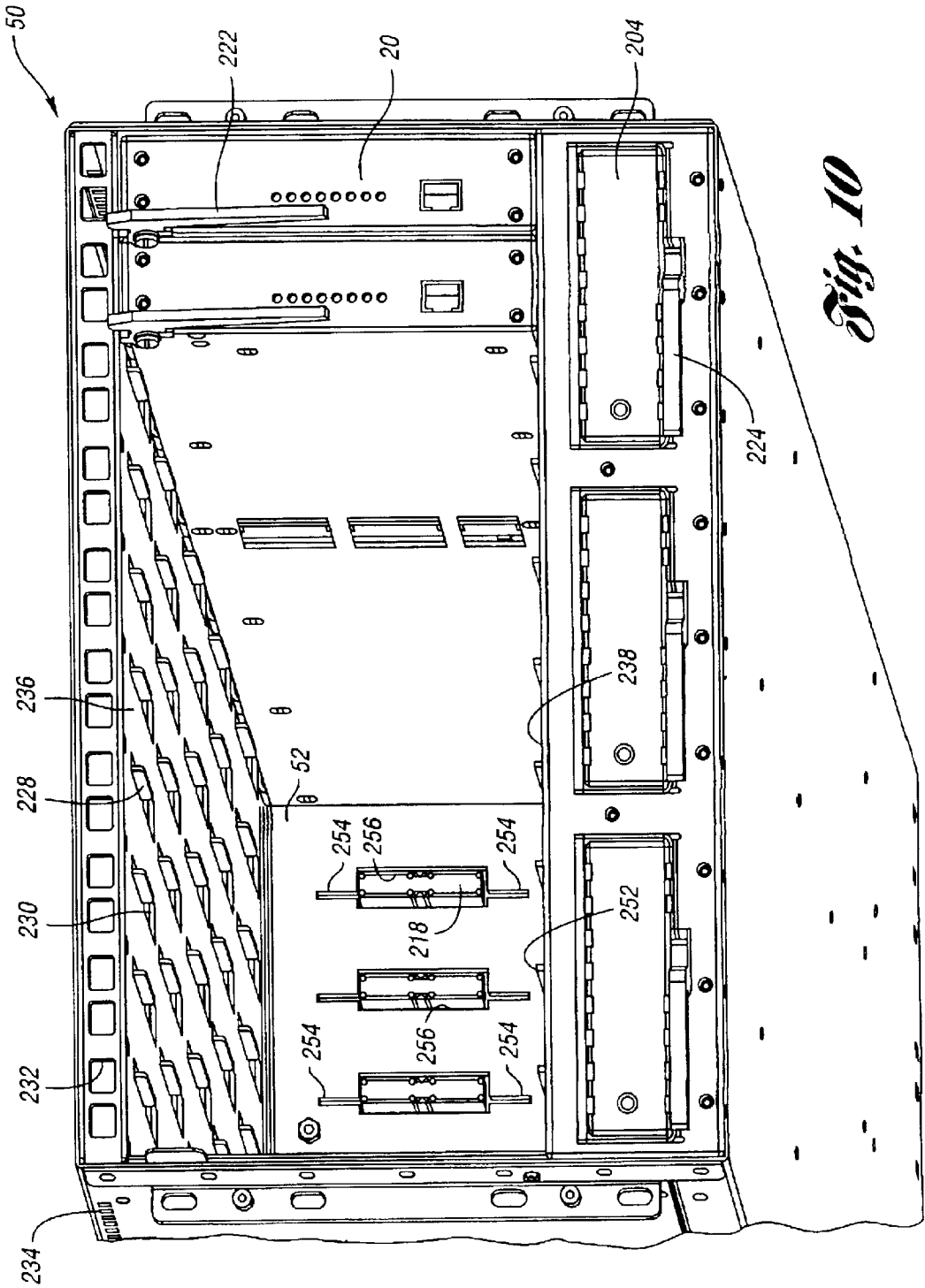
FIG. 10 is a front perspective view of a partially assembled data storage module according to an embodiment of the present invention.

Referring now to FIG. 10, the data storage module 20 is shown from another perspective to illustrate additional features of the housing 200. Lower guide flanges 252 are provided in the lower wall 238 to guide the drive cluster module 202 as they are inserted and removed from housing 200. Bulkhead alignment slots 254 are provided above and below a connector opening 256 in the backplane 52. The bulkhead alignment slots 254 serve to reduce the weight bearing requirements of the connector by supporting the printed circuit board 22 of the drive cluster module 202 directly on the backplane 52. Connector receptacles 218 extend through the connector openings 256. The bulkhead alignment slots 254 receive the alignment tabs 258 securely positioned to the drive cluster module 202 within the housing and provide electrical connections and mounting features necessary to secure the position and multiplicity of disk drives. The alignment tabs mate with the bulkhead alignment slots 254 in the backplane 52 to relieve the stress on the backplane, or motherboard, connectors.

Figure 11:
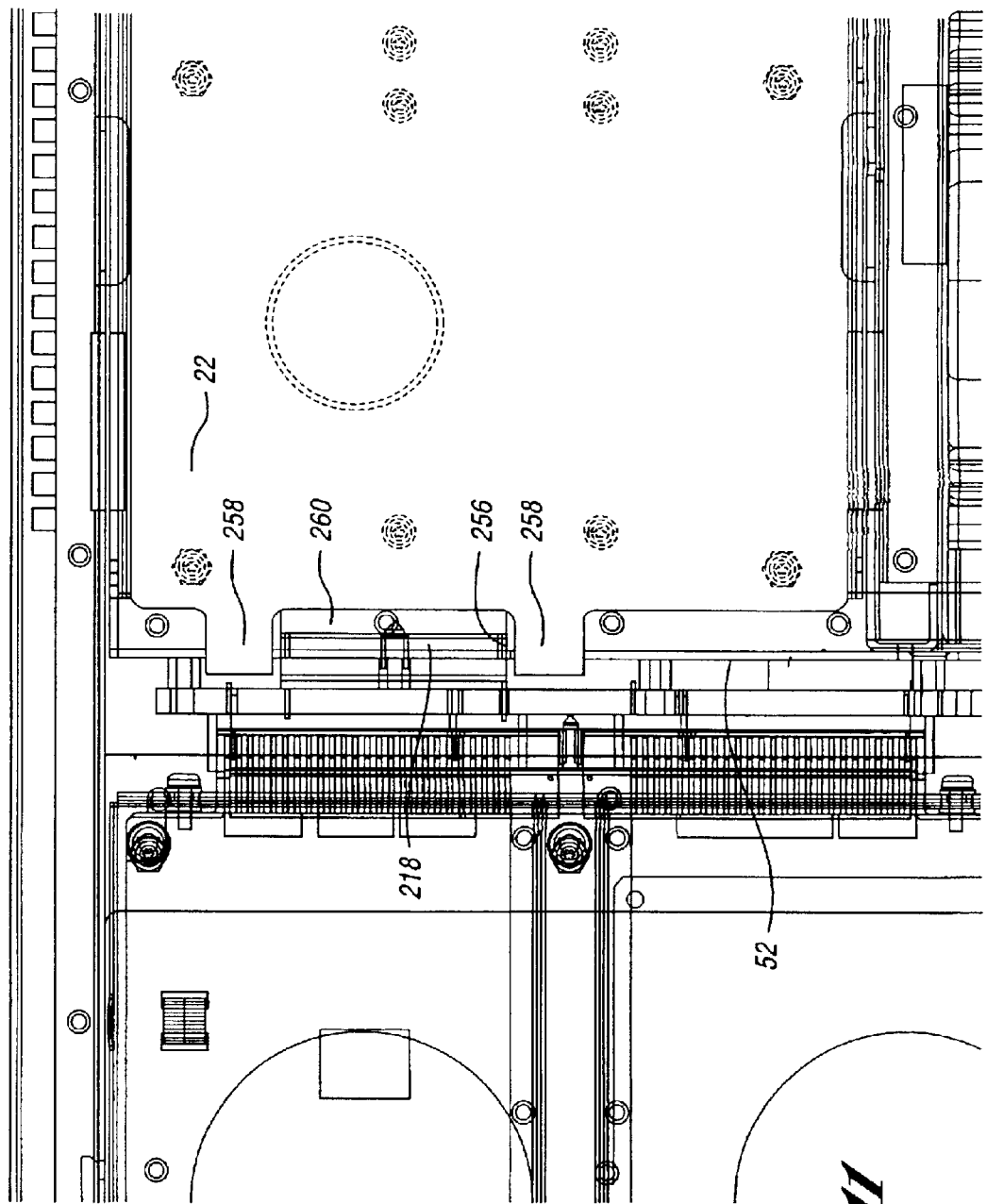
FIG. 11 is a fragmentary cross-sectional view of a printed circuit board attached to the backplane of the data storage module according to an embodiment of the present invention.

Referring now to FIG. 11, connection of data storage module 20 with backplane 52 is shown in greater detail. The printed circuit board 22 includes alignment tabs 258 that are received in bulkhead alignment slots 254 on either side of the connector opening 256. A connector plug 260 is received by the connector receptacle 218 making a connection through the connector opening 256. Connector 260 may function as both media connector 94 and power connector 98 for module 20.

Figure 12:
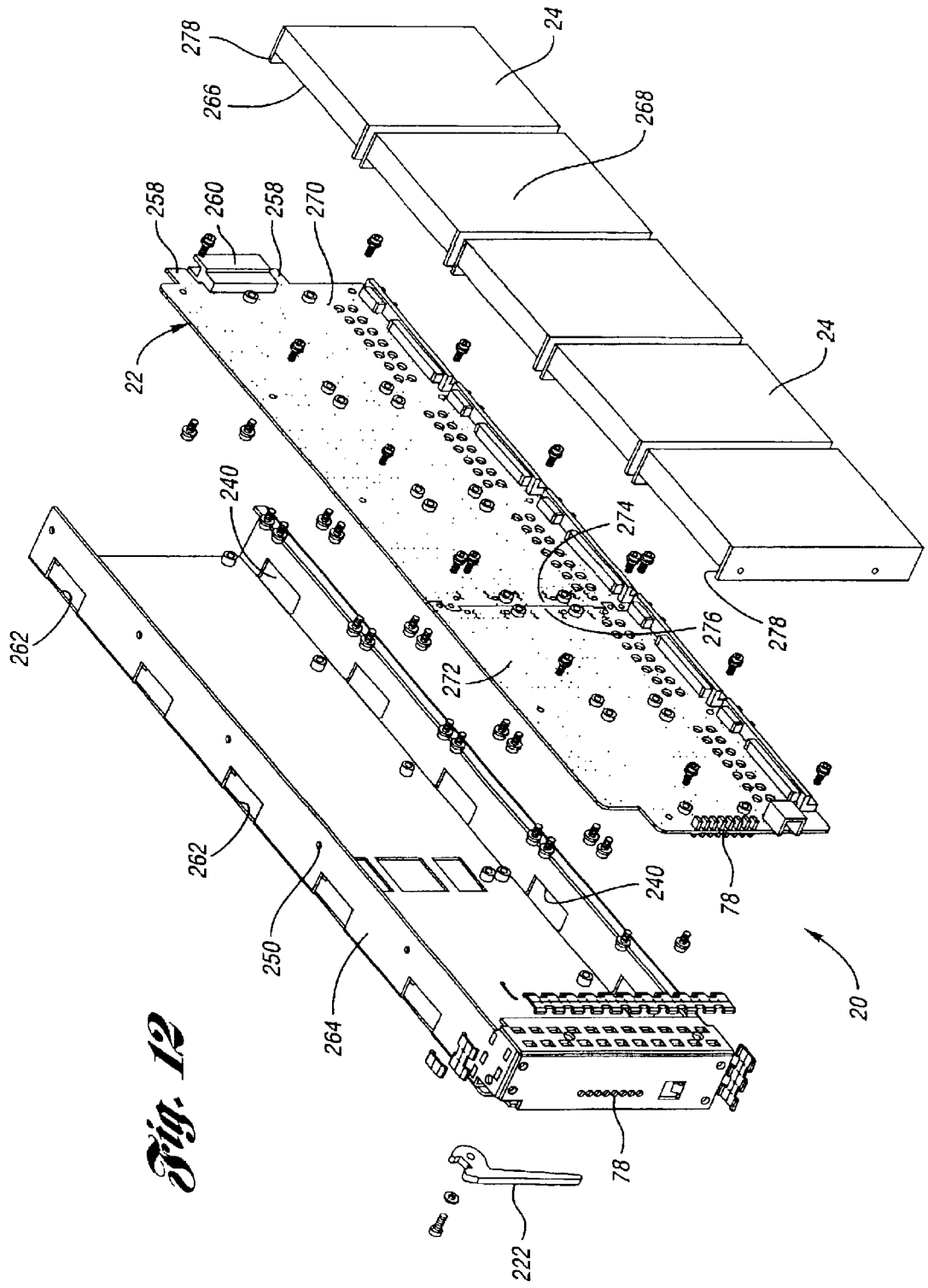
FIG. 12 is an exploded perspective view of a drive cluster module according to an embodiment of the present invention.

Referring now to FIG. 12, the construction of a data storage module 20 is shown in greater detail. The drive cluster module 202 supports five disk drives 24 in the illustrated embodiment. It should be noted that fewer disk drives or additional disk drives could be supported in like manner in data storage module 20. Drive cluster intake ports 262 are provided in a module support plate 264. Air is drawn through the rear intake vents 214, front intake vents 232, and side intake vents 234 by the blowers 220 through the drive cluster intake ports 262. The disk drives 24 have an inner planar face 266 and an outer planar face 268 across which air is drawn from the drive cluster intake ports 262 to the drive cluster exhaust ports 240. It should be noted that air flowing through the drive cluster module 202 generally passes across one disk drive 24 and does not pass over a series of disk drives so that there is not an accumulation of heat caused by air flowing serially across a plurality of disk drives 24. It should be noted that air flows across the inner and outer planar faces 266 and 268.

Also shown in FIG. 12 is the construction of the printed circuit board 22. The printed circuit board 22 may be formed as a primary printed circuit board 270 and a secondary printed circuit board 272. The primary board 270 includes a first mating flange 274, while the secondary board 272 includes a second mating flange 276. First and second mating flanges 274 and 276 are assembled together by means of conventional fasteners. Forming the printed circuit board 22 in two parts improves the ability to manufacture the cards. The use of two smaller cards facilitates the use of conventional circuit board manufacturing equipment and requires the assembly of fewer parts on each board.

Special drive connectors 278 are provided on the disk drives 24 to space the disk drives mounted on the printed circuit board 22 to permit cooling air to pass across the inner planar face 266 and outer planar face 268.

Figure 13:
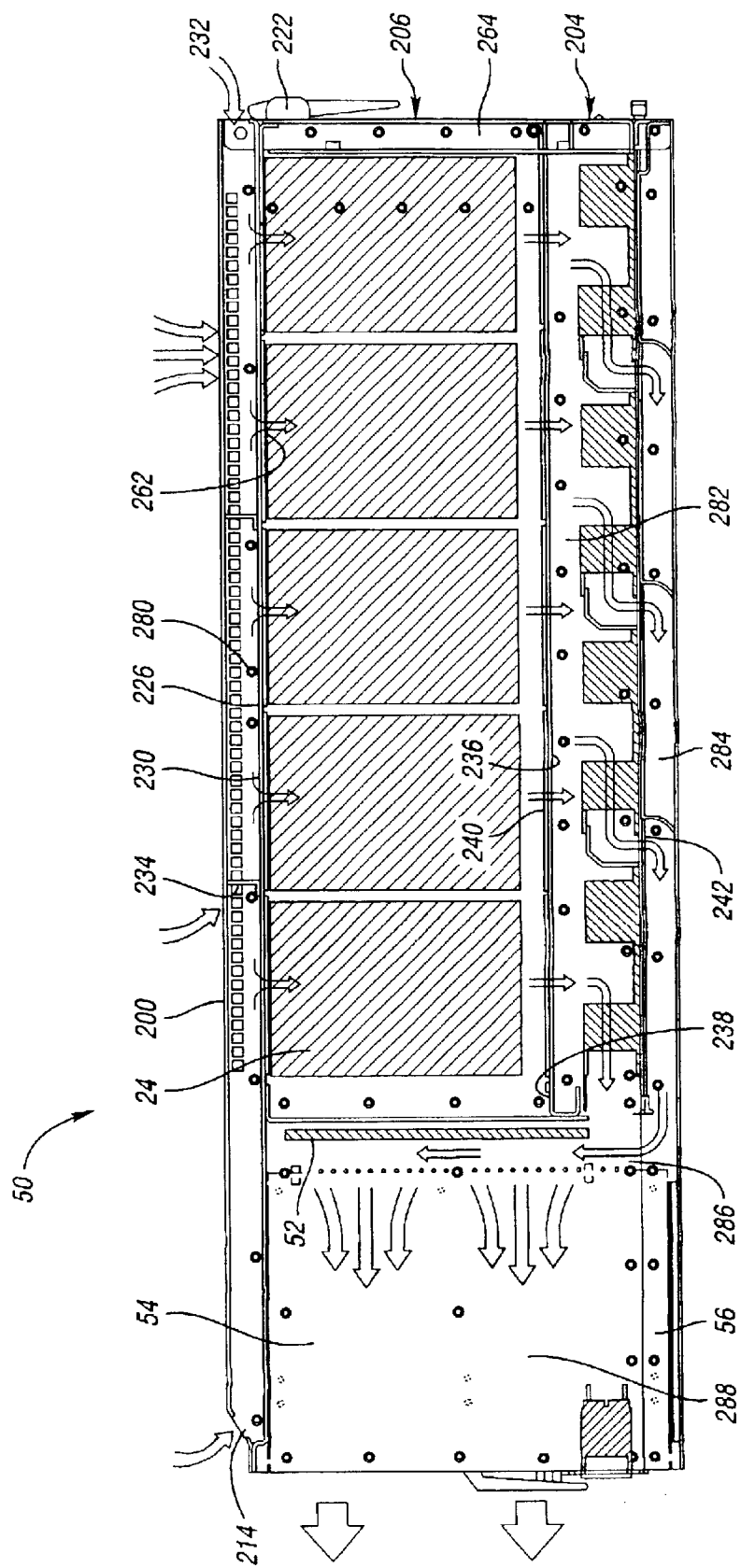
FIG. 13 is a side elevation cross-sectional view of a data storage module according to an embodiment of the present invention.

Referring now to FIG. 13, air flow through a data storage system according to an embodiment of the present invention is shown. Air flows into the housing 200 through the rear intake vents 214, front intake vents 232, and side intake vents 234 into an upper air plenum 280. Air is drawn by the blowers 220 in the blower cluster module 204 across the inner planar face 266 and outer planar face 268 of the disk drives 24. After passing across the planar faces 266 and 268, air passes into a mid-air plenum 282 that is defined between the drive cluster exhaust ports 224 in the lower wall 238 and the blowers 220. Air is drawn through the blowers 220 and into a lower air plenum 284 located below the blower cluster module 204 through the blower exhaust ports 242. Cooling air then flows through the rear module air plenum 286 and into the power supply compartment 288 defined by the housing 200. The power supplies 54 each include power supply exhaust blowers 212 that draw the cooling air across the power supplies and out of the module housing 200.

Figure 14:
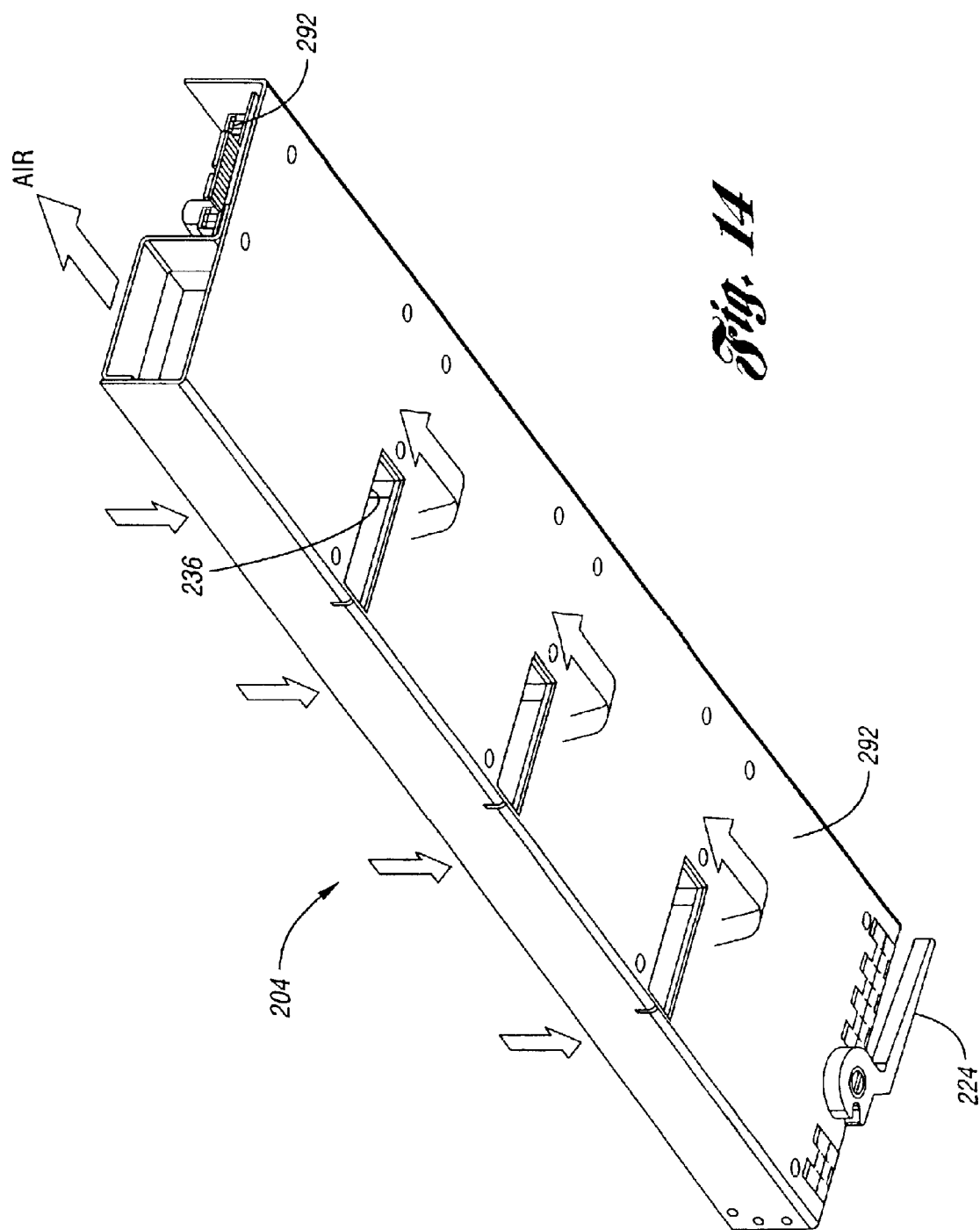
FIG. 14 is a bottom rear perspective view of a blower cluster module according to an embodiment of the present invention.

Referring now to FIG. 14, the blower cluster module 204 is shown to include a blower support plate 290. The blower cluster module 204 also includes a blower connector 292 that connects the blower cluster module 204 to control circuitry for data storage system 50. The blower cluster module 204 is positioned below the mid-air plenum 282 as previously described and air is drawn by the blowers 220 into the lower air plenum 284 through the lower air plenum ports 236. The blower cluster module 204 is secured within the module housing 200 by means of the blower module lever/latch 224 as previously described. The lever/latch is used to eject or insert the module into the enclosure.

The cooling system within the module provides adequate air flow through the array of disk drives. The air flow is generally equally distributed so that each drive is provided with approximately the same amount of air. By providing adequate cooling, the life of the drives is extended and integrity of the data is assured. By packaging a large number of drives in a compact enclosure, problems relating to directing air across the disk drive are reduced because air is channeled through the modules, blowers, and power supplies prior to exiting the enclosure.

The size of the rear intake vents 214, front intake vents 232, and side intake vents 234 may be varied to provide adequate air supply. Upper air plenum ports 230 in the upper wall 226 and lower air plenum ports 236 in the lower wall 238 may be sized to meter and balance air flow over various components to minimize and control temperature rise in the enclosure.

Figure 15:
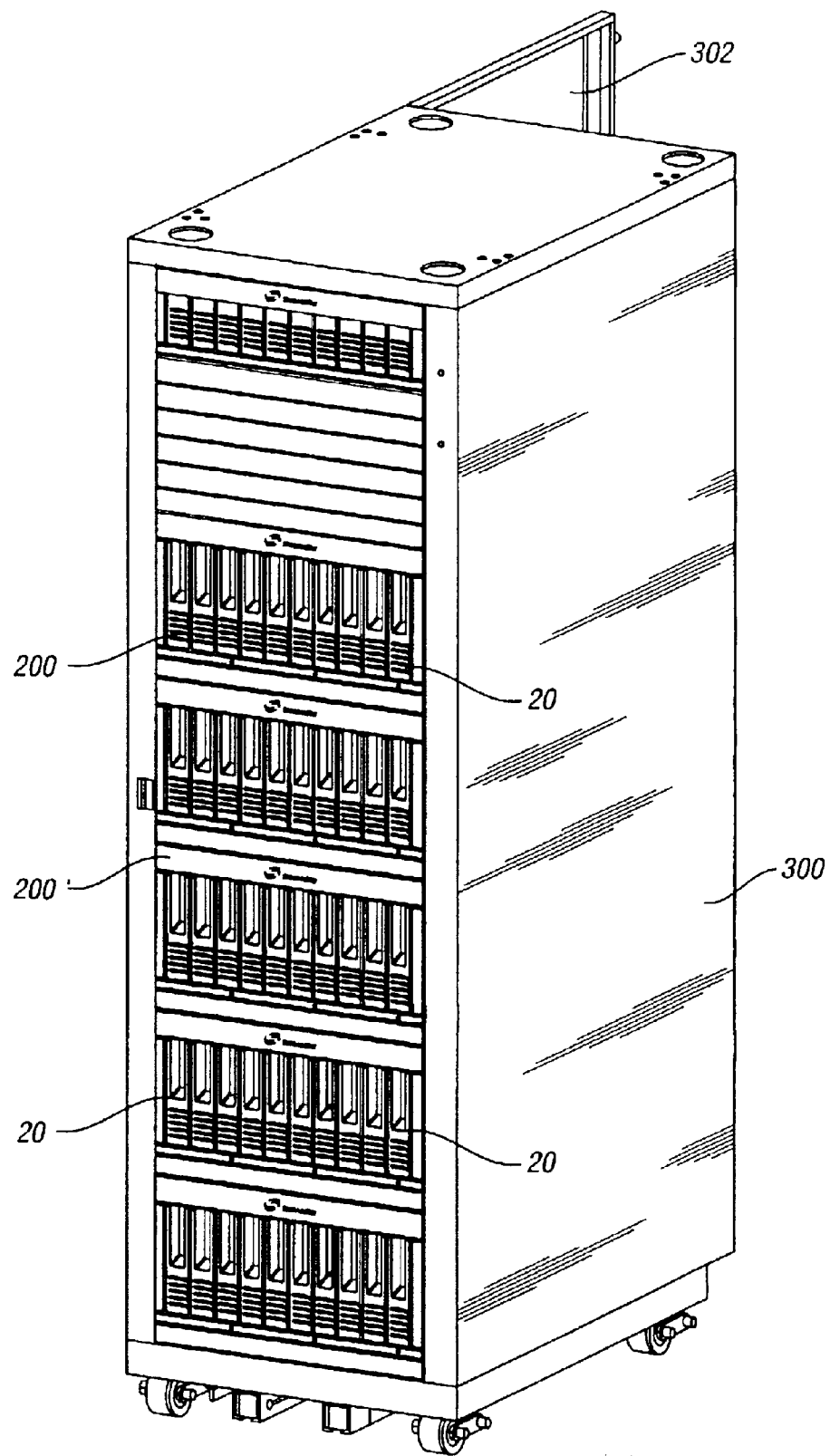
FIG. 15 is a front perspective view of a three-dimensional array of disk drives in a cabinet housing several multiple disk drive modules.
Figure 16:
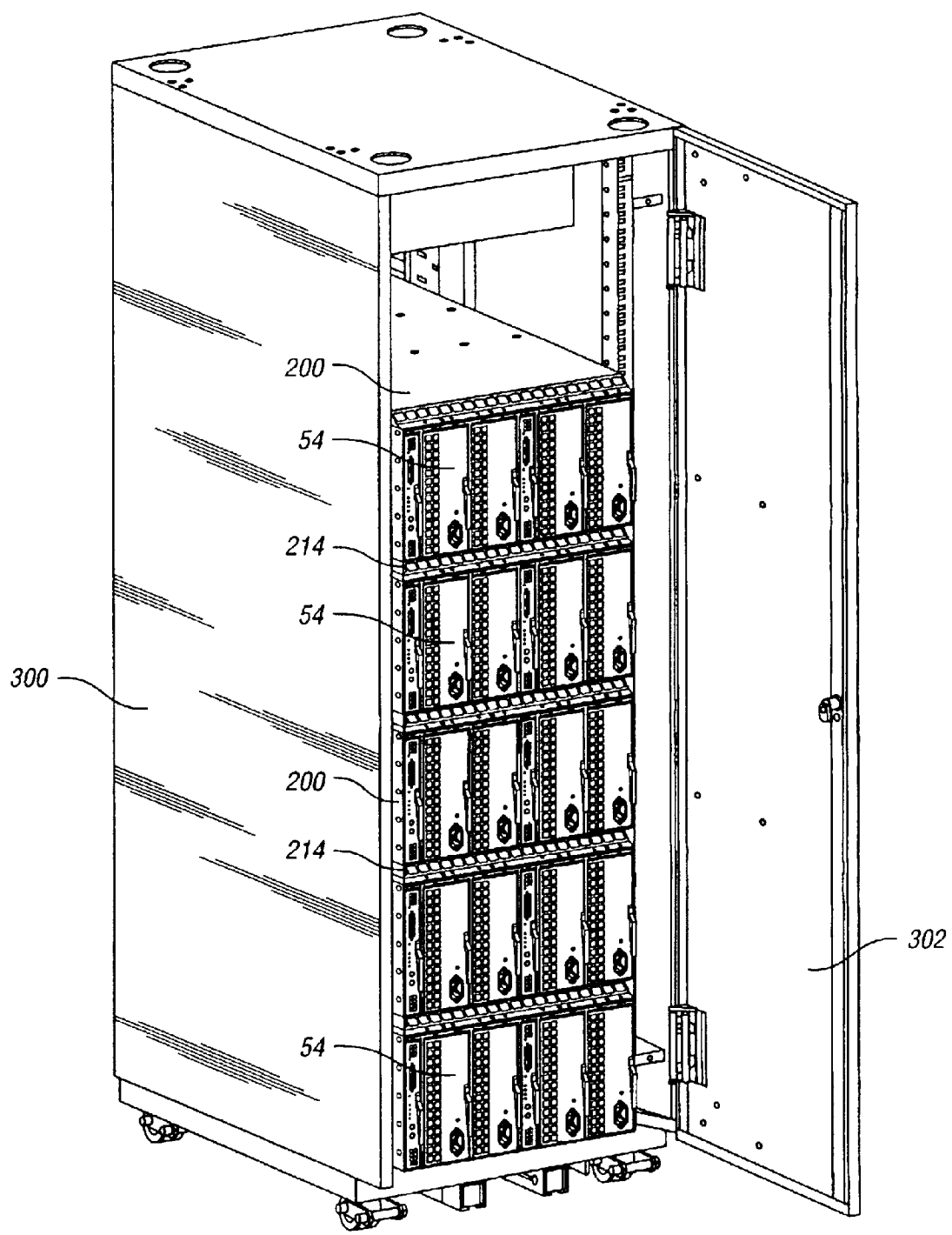
FIG. 16 is a rear perspective view of a three-dimensional array of disk drives in a cabinet housing several multiple disk drive modules.

Referring now to FIGS. 15 and 16, a cabinet 300 having a rear access door 302 is illustrated. The plurality of module housings 200 each support a plurality of data storage modules 20. In the embodiment shown in FIG. 15, ten data storage modules 20 are provided in each of the five illustrated module housings 200. As will be readily appreciated, each data storage module 20 in the embodiment illustrated in FIGS. 15 and 16 support five disk drives 24 so that 250 disk drives 24 are supported in the cabinet in the modular three-dimensional array five deep, five high, and ten across. Each module housing 200 defines a separate cooling air flow path, as previously described with reference to FIGS. 7–14, so that air flows through only a single layer of disk drives 24 from the time that it is drawn in through the intake vents as described above, including rear intake vents 214 through the blower cluster module 204 and across the power supply 54.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A disk drive assembly, comprising:
   a housing having a plurality of walls;
   a first portion of the housing forming an upper air plenum having a plurality of intake vents;
   a plurality of disk drives disposed within a second portion of the housing, a first plurality of air flow paths being defined around the disk drives, the first and second portion of the housing being separated by an upper wall having at least one air plenum port above each of the plurality of disk drives;
   a lower wall separating the second portion of the housing and a third portion of the housing, the lower wall having at least one air plenum port below each of the plurality of disk drives;
   a plurality of blowers disposed within the third portion of the housing, the blowers drawing air through the upper air plenum, into the air flow paths and into a fourth portion of the housing; and
   at least one power supply disposed within the fourth portion of the housing, the at least one power supply defining a second plurality of air flow paths around the power supply down stream from the plurality of blowers.

2. The disk drive assembly of claim 1 wherein the housing has intake openings in at least some of the walls through which air is drawn into the housing and exhaust openings through which air exits the housing.

3. The disk drive assembly of claim 1 wherein a plurality of the disk drives are mounted on each of a plurality of printed circuit boards in the second portion of the housing, the third portion of the housing spanning a first side of the second portion of the housing to allow air to be drawn from a second side of the second portion of the housing across a single disk drive and into the third portion of the housing by the plurality of blowers.

4. The disk drive assembly of claim 1 wherein the disk drives are mounted on each of a plurality of printed circuit boards, the disk drives having a data storage disk rotatably mounted in the disk drive for rotation in a plane, the disk drives each being attached to a printed circuit board with an air flow path being defined on both sides of the disk parallel to the plane.

5. The disk drive assembly of claim 1 wherein the plurality of blowers are disposed on a series of modular racks, the second and third portions of the housing having a common side through which the blower draws air from the second portion of the housing and into the third portion of the housing.

6. The disk drive assembly of claim 1 wherein the plurality of disk drives are mounted on each of a plurality of printed circuit boards, the plurality of blowers are disposed on a series of modular racks, and the plurality of printed circuit boards and the series of modular racks are independently removable from a front side of the housing.

7. A multiple disk drive storage apparatus, comprising:
   a housing;
   a first portion of the housing forming an upper air plenum;
   a second portion of the housing separated from the first portion of the housing by an upper wall having a plurality of upper air plenum ports;
   a plurality of disk drives arranged within the second portion of the housing with a portion of the disk drives being secured to one of a first plurality of carriers, the disk drives being arranged in a single plane;

a third portion of the housing forming a midair plenum, the second and third portions of the housing separated by a lower wall having a plurality of lower air plenum ports;

a plurality of blowers arranged within the third portion of the housing with each of the blowers being secured to one of a second plurality of carriers, the third portion of the housing having a side through which air is drawn that spans a side of the second portion of the housing that is parallel to the plane in which the disk drives are disposed, wherein air is drawn transversely across the planar arrangement of disk drives so that air flowing across one disk drive does not flow substantially across another disk drive.

8. The multiple disk drive storage apparatus of claim 7 further comprising a fourth portion of the housing containing at least one power supply, the fourth portion of the housing receiving air after the air has passed through the upper air plenum, the second portion of the housing, the third portion of the housing, and a lower air plenum below the plurality of blowers.

9. The multiple disk drive storage apparatus of claim 8 wherein the first portion of the housing has intake openings through which air is drawn into the housing and the fourth portion of the housing has exhaust openings through which air exits the housing.

10. The multiple disk drive storage apparatus of claim 7 wherein the disk drives are mounted on plurality of printed circuit boards, the disk drives having a data storage disk rotatably mounted in the disk drive for rotation in a plane, the disk drives each being attached to a printed circuit board with an air flow path being defined on both sides of the disk parallel to the plane.

11. The disk drive assembly of claim 7 wherein the first plurality of carriers and the second plurality of carriers are independently removable from a front side of the housing.

12. A cooling system for a data storage system comprising:

a housing having air intake vents through which air is drawn into an air intake plenum;

a plurality of disk drives disposed in the housing, the plurality of disk drives assembled in modular subassemblies, wherein the air intake plenum is located above the disk drives;

a plurality of blowers drawing air from the air intake plenum past the disk drives and into an intermediate plenum located between the plurality of disk drives and the plurality of blowers, the blowers assembled together in modular subassemblies;

a plurality of power supplies disposed in the housing, the blowers drawing air from the intermediate plenum through the blowers to a lower plenum located between the blowers and the power supplies;

the housing having exhaust ports through which air is exhausted after passing through the power supplies;

wherein the modular assemblies of the disk drives and the modular assemblies of the blowers are independently removable from the housing by sliding through different holes in the housing.

13. The cooling system of claim 12 wherein the air intake vents are formed in a front wall, two side walls and a rear wall.

14. The cooling system of claim 12 wherein the intermediate plenum is located below the disk drives and above the blowers.

15. The cooling system of claim 12 wherein the lower plenum is located below the blowers.

16. The cooling system of claim 12 wherein the power supplies are located in a rear portion of the housing behind the blowers and the plurality of disk drives.

17. The cooling system of claim 12 wherein the disk drives have a rotatable disk for data storage that rotates in a plane that is perpendicular to the air intake plenum and the intermediate plenum.

18. The cooling system of claim 12 wherein air passages are provided for air to be drawn across two sides of the disk drives on opposite sides of the plane in which the rotatable disks rotate.

* * * * *